United States Patent [19]
Matsubara et al.

[11] Patent Number: 6,084,053
[45] Date of Patent: Jul. 4, 2000

[54] ELECTRONIC PART AND PROCESS FOR MANUFACTURING THE SAME

[75] Inventors: Minoru Matsubara, Tsukuba; Yasutake Inoue, Tsuchiura; Mayumi Kakuta, Tsuchiura; Igor Rozhanskii, Tsuchiura; Kohei Goto, Tsukuba, all of Japan

[73] Assignee: JSR Corporation, Tokyo, Japan

[21] Appl. No.: 09/060,105

[22] Filed: Apr. 15, 1998

[30] Foreign Application Priority Data

Apr. 30, 1997 [JP] Japan ..................... 9-124775
Oct. 15, 1997 [JP] Japan ..................... 9-282412

[51] Int. Cl.$^7$ ............. C08G 73/10; B32B 27/00
[52] U.S. Cl. ............... 528/170; 528/28; 528/33; 528/35; 528/125; 528/128; 528/170; 528/173; 528/174; 528/175; 528/179; 528/183; 528/185; 528/188; 528/220; 528/229; 528/350; 528/353; 428/411.1; 428/473.5; 428/901; 427/372.2; 427/384; 264/212; 264/272.17
[58] Field of Search ................... 528/33, 28, 35, 528/353, 125, 170, 128, 172–173, 174, 175, 179, 183, 185, 188, 220, 229, 350; 427/372.2, 384; 428/473.5, 411.1, 901; 264/272.17, 212

[56] References Cited

U.S. PATENT DOCUMENTS 3,758,434  9/1973  Kunzel et al. .................... 528/353

OTHER PUBLICATIONS

G. Boiteux, et al., Die Angewandte Makromolekulare Chemie, vol. 172, No. 2917, pp. 207–232, "Etude de Polymeres Thermostables en vue de Leurs Applications en Electronique", 1989, (with English Summary).

Primary Examiner—P. Hampton-Hightower
Attorney, Agent, or Firm—Oblon, Spivak, McClelland, Maier & Neustadt, P.C.

[57] ABSTRACT

Electronic parts and a process for manufacturing the electronic parts are provided. The electronic parts comprise an electric insulating material exhibiting a high heat resistance and low dielectric constant as a structural component. The electric insulating material is formed of a polyimide containing a recurring unit represented by the following general formula (1).

[Formula (1)]

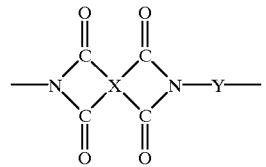

12 Claims, 17 Drawing Sheets

ELECTRONIC PART AND PROCESS FOR MANUFACTURING THE SAME

BACKGROUND OF THE INVENTION

1. Field of the Invention

The present invention relates to an electronic part comprising an electric insulating material made of polyimide as a structural component and a process for manufacturing the electronic part. More particularly, the present invention relates to an electronic part comprising an electric insulating material having excellent heat resistance and low dielectric constant as a structural component, and a process for manufacturing the electronic part.

2. Description of the Background Art

Semiconductor devices such as an LSI (large scale integrated Circuit) which are used for various electric parts and electronic parts are making steady progress in high integration, multifunction, and high performance by virtue of the progress in fine process techniques. Consequently, circuit resistance (hereinafter called "parasitic resistance" from time to time) and the capacity of a capacitor (hereinafter called "parasitic capacity") increase. Along with these increases in the parasitic resistance and capacity, there are increases in not only the power consumption but also in the time delay in response to an input signal. This is the primary cause of low signal speed in semiconductor devices, giving rise to the problem to be solved.

Minimizing the above parasitic resistance and capacity has been proposed as a measure to prevent such a decrease in the signal speed. One method that has been proposed is to cover spaces between wires or the periphery of wires with an insulation film having a low dielectric constant to decrease the parasitic resistance, thereby achieving a high speed signal.

A specific example is to replace an inorganic film formed of silicon dioxide ($SiO_2$) which is a conventional insulating film used between layers with an organic film having a low dielectric constant. The material for such an organic film must have excellent electric insulation and a low dielectric constant to correspond to a high speed signal in semiconductor devices. Such a material must also possess excellent heat resistance to withstand heat treatment (heating step) in a thin-film forming step in a process for manufacturing a mounting substrate or in the stages of chip joining and pin binding.

Here, fluororesins such as polytetrafluoroethylene (PTF) are known as the organic film materials having a low dielectric constant. These fluororesins are, however, insoluble in common organic solvents. Other drawbacks of the fluororesins are their inferior workability and poor handling characteristics. In addition, the fluororesins have an economic disadvantage because the resins must be formed into a specific formulation to be applied for diverse applications of electronic parts. Therefore, the fluororesins are used in very limited fields.

Also, polyimide resins are widely known as high heat-resistant organic materials. There is a known polyimide resin with particularly high heat-resistance which is obtained by reacting 9,9-bis[4-(4-aminophenoxy)phenyl]fluorene used as an amine compound and a pyromellitic acid dianhydride, 3,3',4,4'-biphenyltetracarboxylic acid dianhydride, 3,3',4,4'-diphenylsulfontetracarboxylic acid dianhydride, or 3,3',4,4'-benzophenontetracarboxylic acid dianhydride used as an acid anhydride (J. Polymer Sci., Part A: Polymer Chemistry, Vol. 31, 2153–2163(1993)).

Although these polyimide resins have high heat resistance, their dielectric constant is in the range from 2.9 to 3.5 which cannot yet satisfy the requirements for the layer insulation film used for semiconductors with high speed signal transmission capability.

Another problem with such a polyimide resin is its poor solubility in organic solvents. Not only it is difficult to prepare a uniform thin film from the resin, but also the resin exhibits only poor processablity and handling characteristics.

The present invention has been achieved in view of this situation. Specifically, the present invention has been completed based on the finding that a polyimide obtained by reacting a specific aromatic diamine compound and a specific aromatic tetracarboxylic acid compound has a low specific dielectric constant and excellent heat resistance and solubility in a solvent.

Accordingly, an object of the present invention is to provide an electronic part comprising an electric insulating material formed of polyimide having a low dielectric constant (specific dielectric constant), high heat resistance, as well as superior solubility in various solvents and excellently balanced properties.

SUMMARY OF THE INVENTION

The above objects can be attained in the present invention by the provision of an electronic part comprising, as a structural component, an electric insulating material (hereinafter called "present insulating material")formed of a polyimide(hereinafter called "present polyimide") containing a recurring unit represented by the following general formula (1):

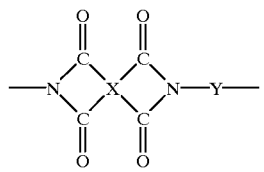

[Formula (1)]

wherein X represents a group selected from the following X1 to X6, Y represents a group selected from the following Y1 to Y3, provided that at least one of X and Y has a fluorene skeleton, R1 to R9 in X1 to X4 and Y1 and Y3 respectively represent an alkyl group, an aryl group, an arylalkyl group, or an alkyl halide group, repeat numbers n, m, p, q, s, t, w and z denote integers from 0 to 2, and repeat number r denotes integers from 1 to 2.

[Formula (X1)]

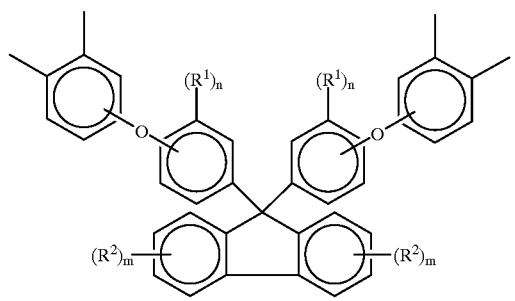

-continued

[Formula (X2)]

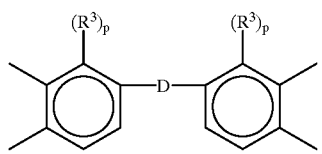

wherein the symbol D represents a group shown by the formula —CYY'—, wherein Y and Y' respectively represent an alkyl group or an alkyl halide group; a group represented by the following formula:

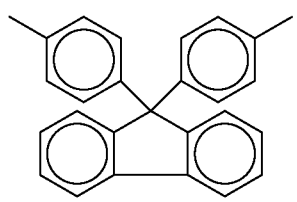

a group represented by the following formula:

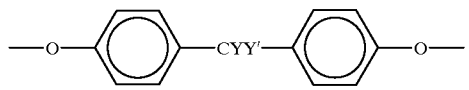

or a group represented by the following formula:

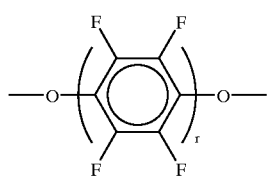

[Formula (X3)]

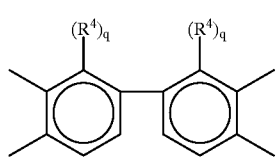

[Formula (X4)]

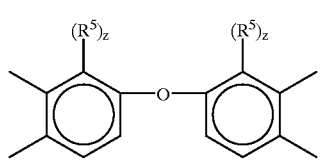

[Formula (X5)]

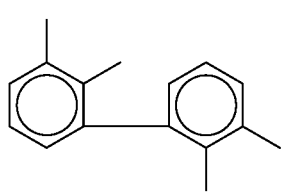

-continued

[Formula (X6)]

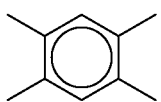

[Formula (Y1)]

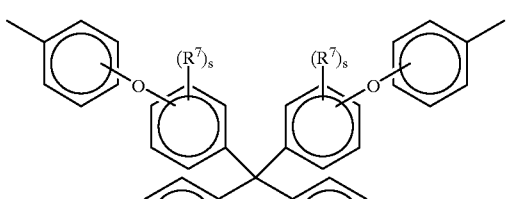

[Formula (Y2)]

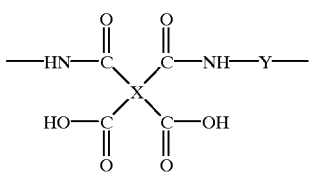

wherein the symbol A represents a group —O—, —C(CH$_3$)$_2$— or —C(CF$_3$)$_2$— and a repeat number u denotes an integer of 0 or 1; and

[Formula (Y3)]

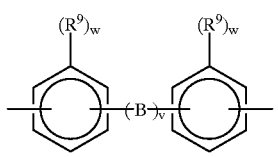

wherein the symbol B represents a group —C(CH$_3$)$_2$—, —C(CF$_3$)$_2$—, —O—,

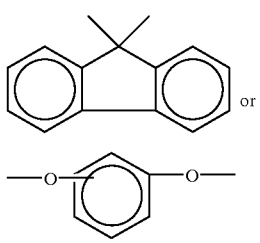 or

and a repeat n umber v denotes an integer of 0 or 1.

In the production of the electronic part of the present invention, it is desirable that X be at least one group selected from the group consisting of X1 to X6 and Y be both or any one of Y1 and Y2 in the general formula (1). This selection ensures production of polyimide exhibiting higher heat resistance, more improved dielectric characteristics (low dielectric constant), and higher solubility in solvents.

In the production of the electronic part of the present invention, preferably X is at least one group selected from X1 to X6 and Y is Y1 in the general formula (1).

This selection ensures production of polyimide exhibiting higher heat resistance, more particularly improved dielectric characteristics (low dielectric constant), and higher solubility in solvents.

In the production of the electronic part of the present invention, preferably X is at least one group selected from X1, X2, and X5 and Y is Y1 in the general formula (1). This selection ensures production of polyimide exhibiting higher heat resistance, more particularly improved dielectric characteristics (low dielectric constant), and particularly higher solubility in solvents.

In the production of the electronic part of the present invention, preferably X is X1 and Y is at least one group selected from Y1 to Y3 in the general formula (1). This selection ensures production of polyimide exhibiting higher heat resistance, more particularly improved dielectric characteristics (low dielectric constant), and particularly higher solubility in solvents.

In the production of the electronic part of the present invention, preferably Y in the general formula (1) includes the following group Y4:

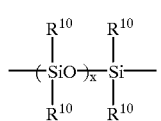

[Formula (Y4)]

wherein R10 represents an alkyl group or an aryl group, and a repeat number x denotes an integer from 1 to 100. By introducing of a siloxane compound into the molecule of the polyimide, the adhesion of these films to semiconductor substrates remarkably improves.

In the production of the electronic parts of the present invention, preferably the inherent viscosity of polyimide (measured in a N-methylpyrrolidone solvent at a concentration of 0.5 g/dl at 30° C.) is in a range from 0.05 to 10 dl/g. More excellent heat-resistance can be achieved by designing the inherent viscosity of polyimide to be in this range.

In the production of the electronic parts of the present invention, preferably the content of fluorine in polyimide is within a range from 0.1 to 30% by weight. If the content of fluorine in polyimide is in this defined range, a lower dielectric constant is attained while maintaining excellent heat-resistance. In addition, the polyimide having the above fluorine content exhibits higher solubility in a solvent.

In the production of the electronic parts of the present invention, the polyimide may contain the recurring unit shown by the following general formula (2) at a proportion of 50 mol % or less, preferably 10 mol % or less, and more preferably 5 mol % or less:

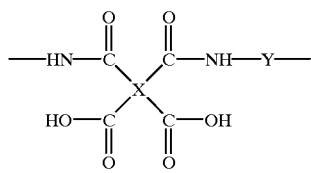

[Formula (2)]

wherein X and Y are the same as previously defined for the formula (1).

In the production of the electronic parts of the present invention, the dielectric constant (frequency: 1 MHz) of polyimide is preferably 2.95 or less. When the dielectric constant of polyimide is in this range, excellent high frequency properties can be obtained, whereby a sufficiently high speed signal transmission in semiconductor devices can be ensured.

In the production of the electronic parts of the present invention, preferably the present electric insulating material forms a layer insulation film or a flattening film.

In the production of the electronic part of the present invention, preferably the electronic part is a semiconductor device.

Another embodiment of the present invention relates to a process for manufacturing the above electronic parts, which comprises the following steps (A) to (C):

(A) a step of synthesizing a polyimide containing the above recurring unit represented by the general formula (1) and adding a solvent to the resulting polyimide to prepare a polyimide solution;

(B) a step of laminating the polyimide solution on a substrate; and (C) a step of drying the laminated polyimide solution to form an electric insulating part.

In the production of the electronic parts of the present invention, the solvent is preferably at least one solvent selected from the group consisting of N-methylpyrrolidone, N, N-dimethylformamide, N,N-dimethylacetamide, γ-butylolactone, ethyl lactate, methoxymethyl propionate, propylene glycol monomethyl ether acetate, and cyclohexanone. The use of these solvents ensures production of a more intimate and uniform polyimide film and consequently excellent mechanical properties. Higher heat-resistance can be obtained.

Other and further objects, features and advantages of the present invention will appear more fully from the following description.

DETAILED DESCRIPTION OF THE INVENTION AND PREFERRED EMBODIMENTS

Figure 1:
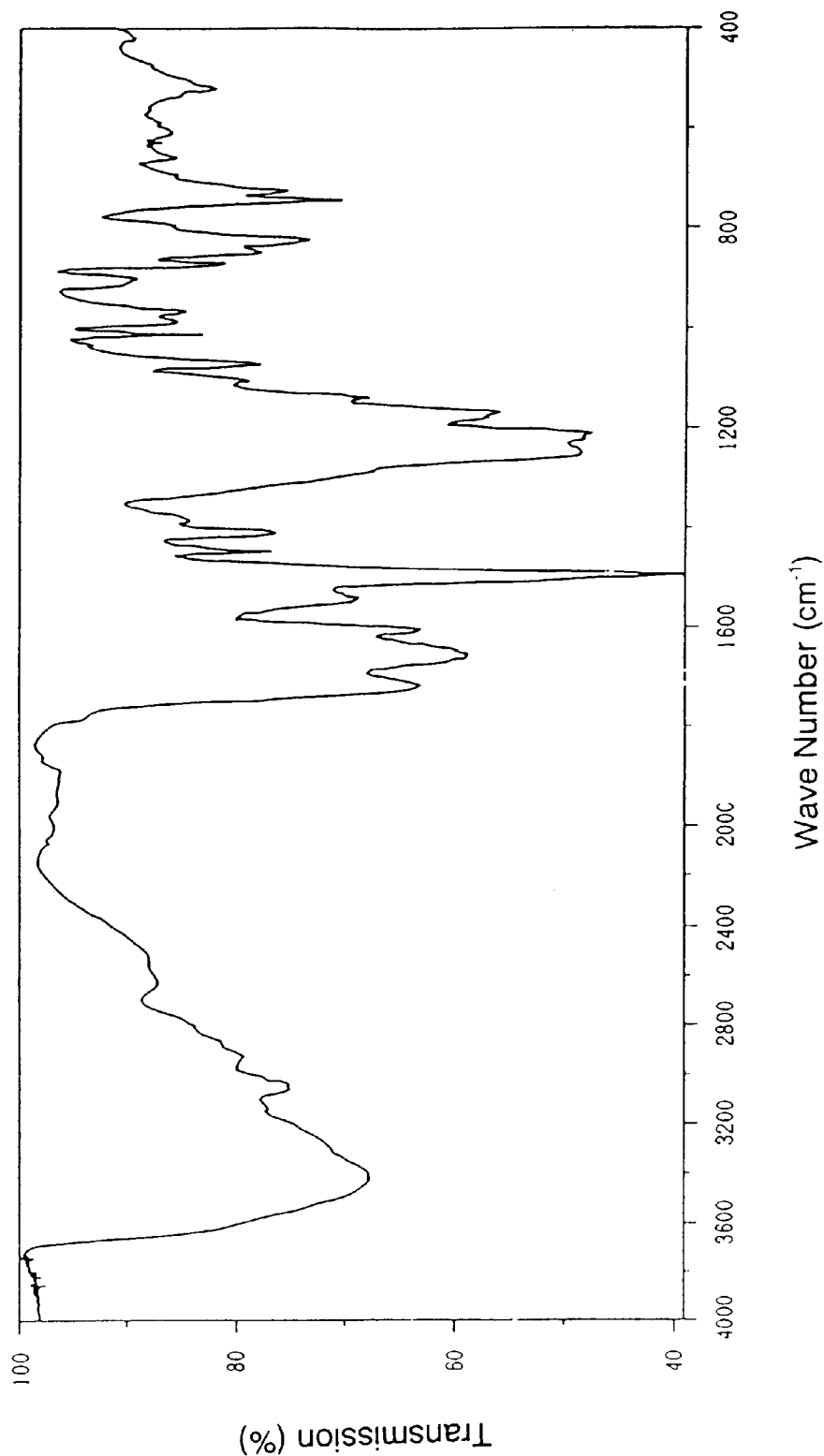
FIG. 1 is an IR chart of the polyamic acid produced in the Example 1.

The embodiments of the electronic parts and the process of present invention will now be explained in detail.

1. Electronic parts

There are no limitations to the electronic parts of the present invention to the extent that these contain the present insulting material as at least a part or all of the structural component. Preferably the electronic parts are any one of layer insulation films, flattening films, capacitor insulating films which are all used in semiconductor devices, high frequency board materials, flexible printed board materials, TAB tape materials, and film carrier substrates which are contain the present insulting material.

Examples of the present polyimide forming the present electric insulating material, include polyimide resins shown below and polyamic acid as a precursor of the polyimide resins, or any one of these compounds (these compounds are called simply "polyimide" from time to time).

(1) Synthesis 1 of polyimide

When synthesizing the polyimide (polyimide resin and polyamic acid), the aromatic tetracarboxylic acid compounds represented by the above X1 to X6 and the aromatic diamine compounds represented by Y1 to Y3 may be used. More specifically, the aromatic tetracarboxylic acid compounds and aromatic diamine compounds shown below are preferably used.

① X1

Given as examples of the aromatic tetracarboxylic acid compound represented by X1 are 9,9-bis[4-(3,4-dicarboxyphenoxy)phenyl]fluorene dianhydrides shown by the formula (3), and 9,9-bis[4-(3,4-dicarboxyphenoxy)-3-phenyl)phenyl]fluorene dianhydride shown by the formula (4) or derivatives of these.

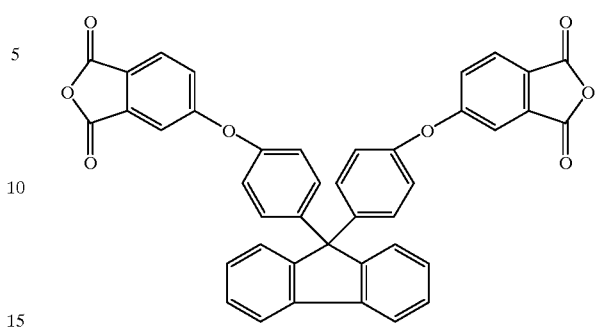

[Formula (3)]

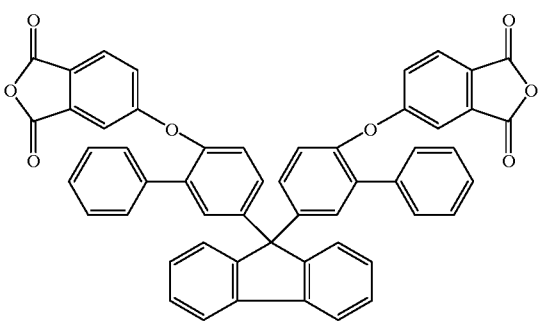

[Formula (4)]

9,9-bis[4-(3,4-dicarboxyphenoxy)phenyl]fluorene dianhydrides shown by the formula (3), and 9,9-bis[4-(3,4-dicarboxyphenoxy)-3-phenylphenyl]fluorene dianhydride shown by the formula (4) are desirable as the aromatic tetracarboxylic acid compound which is used in the present invention because these compounds allow the production of a polyimide having a lower dielectric constant and high heat-resistance.

These aromatic tetracarboxylic acid compounds represented by X1 may be used either independently or in combinations of two or more.

② X2

Examples of the aromatic tetracarboxylic acid compounds include 2,2-bis(3,4-dicarboxyphenyl)hexafluoropropane dianhydride represented by the formula (5) or its derivatives, 4,4'-bis(3,4-dicarboxyphenoxy)octafluorobiphenyl dianhydride represented by the formula (6) or its derivatives, 2,2-bis[4-(3,4-dicarboxyphenoxy)phenyl] hexafluoropropane dianhydride represented by the formula (7) and its derivative, 1,4-bis(3,4-dicarboxyphenoxy) tetorafluorobenzen dianhydride represented by the formula (8) or its derivatives, and 9,9-bis[4-(3,4-dicarboxyphenyl) phenyl]fluorene dianhydride represented by the formula (9) or its derivatives.

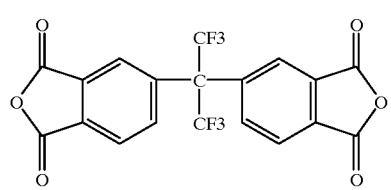

[Formula (5)]

[Formula (6)]

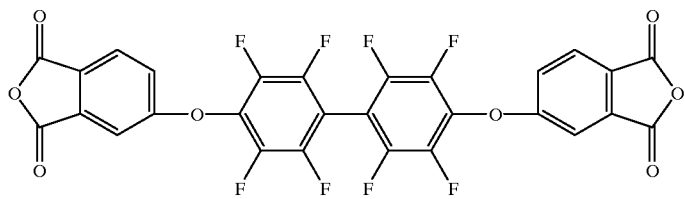

[Formula (7)]

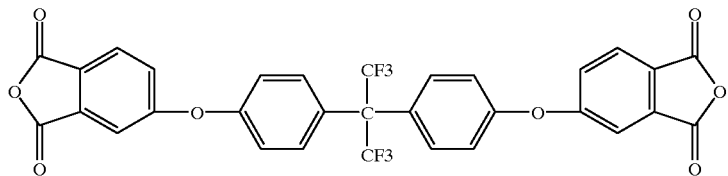

[Formula (8)]

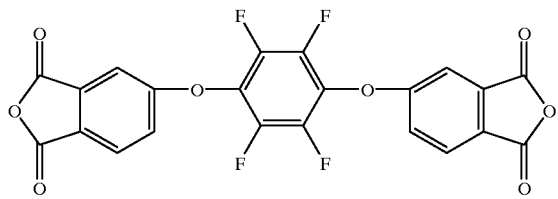

[Formula (9)]

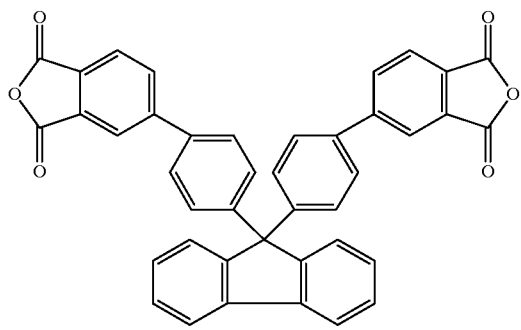

Among these compounds, especially 2,2-bis(3,4-dicarboxyphenyl)hexafluoropropane dianhydride represented by the formula (5) or 2,2-bis[4-(3,4-dicarboxyphenoxy)phenyl]hexafluoropropane dianhydride represented by the formula (7) is desirable as the aromatic tetracarboxylic acid compound which is used in the present invention with a view to preparing a polyimide with a lower dielectric constant.

These aromatic tetracarboxylic acid compounds represented by X2 may be used either independently or in combinations of two or more.

③ X3

Examples of the aromatic tetracarboxylic acid compounds represented by X3 include 3,3',4,4'-biphenyltetracarboxylic acid dianhydride represented by the formula (10) and its derivatives:

[Formula (10)]

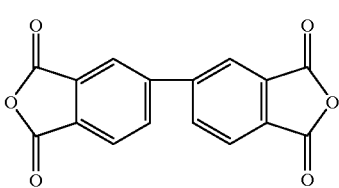

④ X4

Examples of the aromatic tetracarboxylic acid compounds represented by X4 include bis(3,4-dicarboxyphenyl)ether dianhydride represented by the formula (11) and its derivatives:

[Formula (11)]

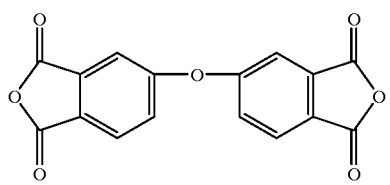

⑤ X5

Examples of the aromatic tetracarboxylic acid compounds represented by X5 include 2,2',3,3'-biphenyltetracarboxylic acid dianhydride represented by the formula (12) and its derivatives:

[Formula (12)]

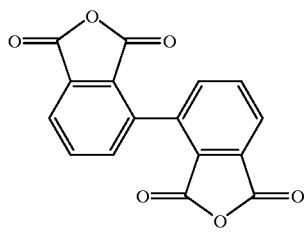

⑥ X6

Examples of the aromatic tetracarboxylic acid compounds represented by X6 include pyromellitic acid dianhydride represented by the formula (13) and its derivatives:

[Formula (13)]

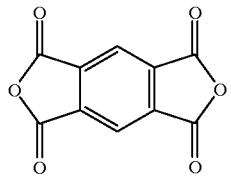

⑦ Y1

Example of the aromatic diamine compounds include 9,9-bis[4-(4-aminophenoxy)phenyl]fluorene represented by the formula (14) or its derivatives, 9,9-bis[4-(4-amino-2-methylphenoxy)phenyl]fluorene represented by the formula (15) or its derivatives, 9,9-bis[4-(4-amino-2-trifluoromethylphenoxy)phenyl]fluorene represented by the formula (16) or its derivatives, 9,9-bis[4-(4-amino-2-methylphenoxy)-3-methylphenyl]fluorene represented by the formula (17) or its derivatives, 9,9-bis[4-(4-amino-2-trifluoromethylphenoxy)-3-methylphenyl]fluorene represented by the formula (18) or its derivatives, 9,9-bis[4-(4-amino-2-trifluoromethylphenoxy)-3,5-dimethylphenyl] fluorene represented by the formula (19) or its derivatives, 9,9-bis[4-(4-aminophenoxy)-3-phenylphenyl]fluorene represented by the formula (20) or its derivatives, and 9,9-bis [4-(4-amino-2-trifluoromethylphenoxy)-3-phenylphenyl] fluorene represented by the formula (21) or its derivatives.

[Formula (14)]

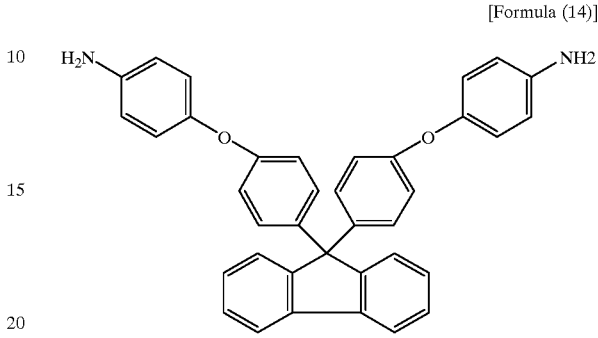

[Formula (15)]

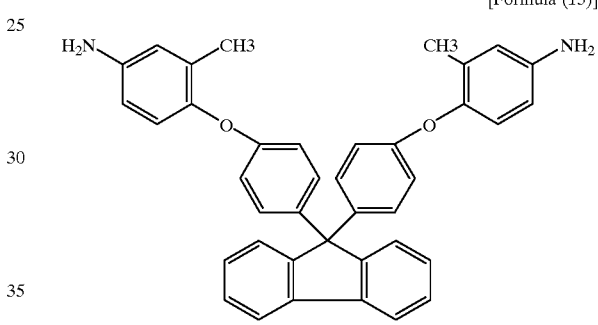

[Formula (16)]

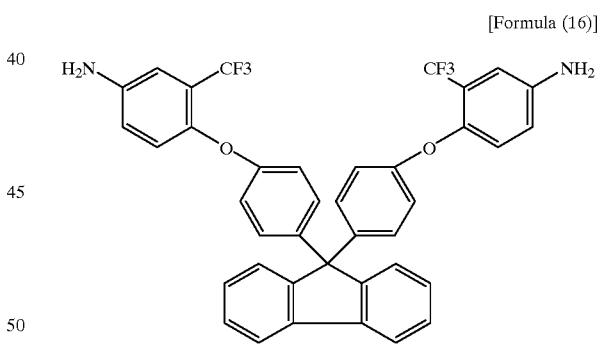

[Formula (17)]

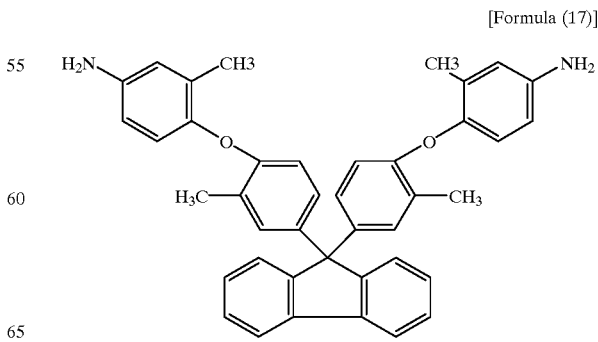

[Formula (18)]

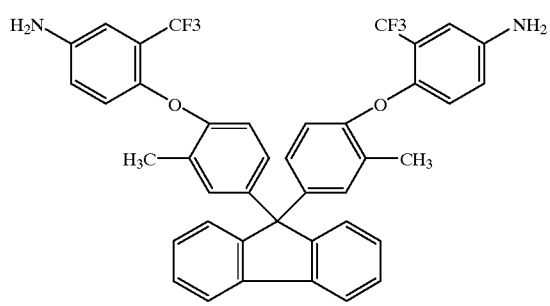

[Formula (19)]

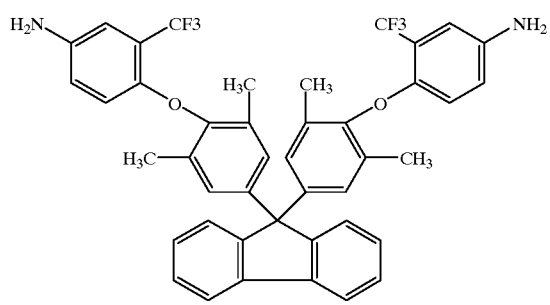

[Formula (20)]

[Formula (21)]

These aromatic diamine compounds represented by Y1 may be used either singly or in combinations of two or more.

Among these compounds, especially 9,9-bis[4-(4-aminophenoxy)phenyl]fluorene represented by the formula (14), 9,9-bis[4-(4-amino-2-trifluoromethylphenoxy)phenyl] fluorene represented by the formula (16), 9,9-bis[4-(4-aminophenoxy)-3-phenylphenyl]fluorene represented by the formula (20), and 9,9-bis[4-(4-amino-2-trifluoromethylphenoxy)-3-phenylphenyl]fluorene represented by the formula (21) are desirably used with a view to preparing a polyimide with a lower dielectric constant and in view of improving the solubility in a solvent.

⑧ Y2

Example of the aromatic diamine compounds represented by Y2 include 2,2-bis[4-(4-aminophenoxy)phenyl]propane represented by the formula (22) or its derivatives, 2,2-bis[4-(4-aminophenoxy)phenyl]-1,1,1,3,3,3-hexafluoropropane represented by the formula (23) or its derivatives, and 4,4-bis[4-(4-aminophenoxy) octafuluorobiphenyl represented by the formula (24) or its derivatives.

[Formula (22)]

$H_2N$—⌬—O—⌬—C(CH3)(CH3)—⌬—O—⌬—$NH_2$

[Formula (23)]

$H_2N$—⌬—O—⌬—C(CF3)(CF3)—⌬—O—⌬—$NH_2$

[Formula (24)]

$H_2N$—⌬—O—(C6F4-C6F4)—O—⌬—$NH_2$

⑨ Y3

Examples of the aromatic diamine compounds include 2,2-bis(4-aminophenyl)-1,1,1,3,3,3-hexafluoropropane represented by the formula (25) or its derivatives, bis(4- aminophenoxy)-1,3-benzene represented by the formula (26) or its derivatives, 9,9-bis(4-aminophenyl)fluorene represented by the formula (27) or its derivatives, 9,9-bis(4-amino-3-methylphenyl)fluorene represented by the formula (28) or its derivatives, 2,2'-bis(trifluoromethyl)benzidine represented by the formula (29) or its derivatives, and 4,4'-oxydianiline (abbreviated as "ODA" from time to time) represented by the formula (30) or its derivatives.

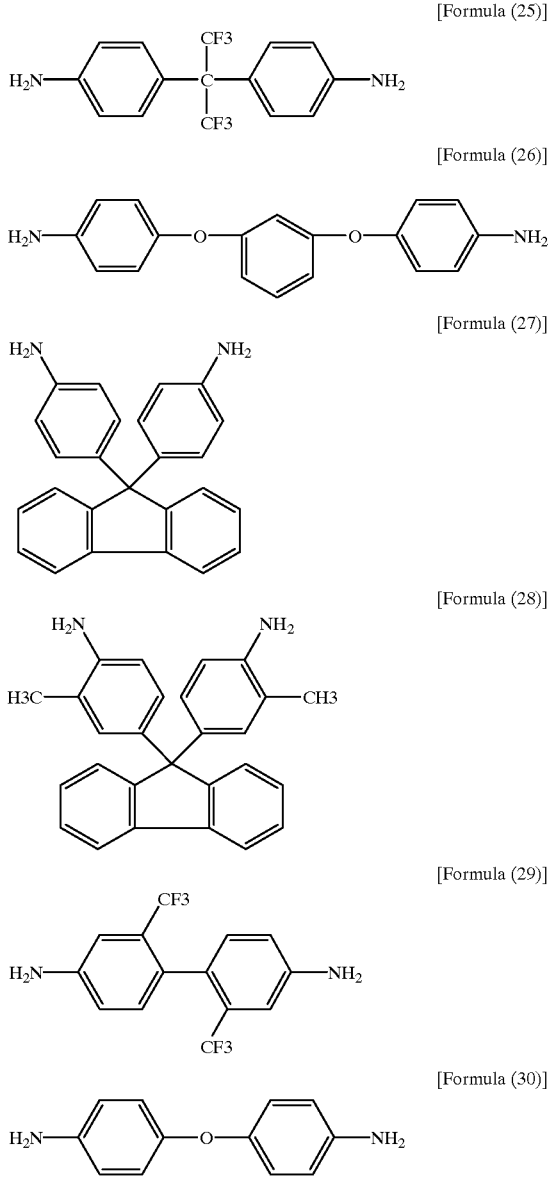

(2) Synthesis 2 of polyimide

In the synthesis of polyimide used for the electronic parts of the present invention, it is desirable that Y in the formula (1) contain the group represented by Y4 as mentioned above. Such an introduction of a siloxane compound into the molecule of the polyimide improves the adhesion of these films such as an insulation film, flattening film, capacitor insulation film and the like to semiconductor substrates.

A siloxane compound such as
1,3-bis(3-aminopropyl)tetramethylsiloxane,
1,3-bis(3-aminophenyl)tetramethylsiloxane,
α,ω-bis(3-aminopropyl)polydimethylsiloxane(n=5),
α,ω-bis(3-aminopropyl)polydimethylsiloxane(n=9),
α,ω-bis(3-aminophenyl)polydimethylsiloxane(n=5),
α,ω-bis(3-aminophenyl)polydimethylsiloxane(n=9)
may be used to introduce the group represented by Y4 into the molecule of polyimide.

These siloxane compounds are desirably reacted with the aromatic tetracarboxylic acid compound in combination with the aromatic diamine compound in the synthesis of polyimide. These siloxane compounds may be used either independently or in combinations of two or more.

Though there are no limitations to the content of the group represented by Y4, it is preferable that the content of the group represented by Y4 be in a range from 1 to 30 mol % for 100 mol % of amine component in the polyimide containing the group represented by Y4. If the content of the group represented by Y4 is less than 1 mol %, no effect from its addition is liable to be exhibited. On the other hand, a content exceeding 30 molt is liable to cause reductions in the glass transition temperature and 5 wt % thermal decomposition temperature of the polyimide.

Therefore, the content of the group represented by Y4 in polyimide is in a range preferably from 3 to 20 mol % and more preferably from 5 to 15 mol %.

In the synthesis of the polyimide used for the electronic parts of the present invention, it is desirable that the content of the recurring unit represented by the general formula (2) be 50 molt or less for 100 mol % of the total recurring units. If the content of the recurring unit represented by the general formula (2) exceeds 50 molt, the glass transition temperature and 5 wt % thermal decomposition temperature of the resulting polyimide tend to decrease. In addition, and further to make it difficult to form an dense thin film.

Therefore, the content of the recurring unit represented by the general formula (2) is preferably 40 mol % or less and more preferably 30 mol % or less for 100 molt of the total recurring units.

(3) Additives for polyimide

It is desirable to add a silane coupling agent to polyimide used for the electronic parts of the present invention. The addition of the silane coupling agent to the polyimide remarkably improves the adhesion of such films as a layer insulation film, flattening film, and capacitor insulation film to the base in semiconductor devices.

There are no specific limitations to the types of silane coupling agents. The following silane coupling agents, for example, may be used either singly or in combinations of two or more.
γ-aminopropyltrimethoxysilane,
γ-aminopropyltriethoxysilane,
γ-aminopropyldimethoxymethylsilane,
γ-aminopropyldiethoxymethylsilane,
γ-glycidoxypropyltrimethoxysilane,
γ-glycidoxypropyltriethoxysilane,
γ-glycidoxypropyldimethoxymethylsilane, and
γ-glycidoxypropyldiethoxymethylsilane.

There are no limitations to the content of the silane coupling agent. For example, the content of the silane coupling agent is desirably in a range from 0.1 to 30 parts by weight for 100 parts by weight of polyimide. If the content of the silane coupling agent is less than 0.1 parts by weight, the effect of its addition tends to be poor whereas if the content exceeds 30 parts by weight, the silane coupling agent tends to be uniformly mixed with polyimide with difficulty. Therefore the content of the silane coupling agent is preferably in a range from 0.5 to 20 parts by weight and more preferably from 1.0 to 10 parts by weight for 100 parts by weight of polyimide to produce a more striking addition effect and to make it easily mixed and dispersed.

It is also desirable that a solvent be added to the polyimide used for the electronic parts of the present invention, to form a polyimide solution (called "polyimide varnish" from time to time). Such an addition of a solvent to polyimide allows a layer insulation film, flattening film, and capacitor insulation film in semiconductors to be formed as a more uniform and dense thin film. Formation of polyimide thin films from such a polyimide solution remarkably improves the adhesion of these thin films to the semiconductor substrates.

(4) Characteristics of polyimide

It is desirable that the polyimide used for the electronic parts of the present invention satisfy the following characteristics ① to ⑥:

① a inherent viscosity (measured in N-methyl-2-pyrrolidone solvent at a concentration of 0.5 g/dl at 30° C.) is in the range from 0.05 to 10 dl/g, ② a glass transition temperature is in the range of 230° C. or higher, ③ a 5 wt % thermal decomposition temperature (in nitrogen gas at a temperature rise of 10° C./minute) is in the range of 400° C. or higher, ④ a specific dielectric constant (at a frequency of 1 MHz) is in the range of 2.9 or less, ⑤ a volume resistivity is in the range of $1 \times 10^{15}$ or more, and ⑥ a fluorine content in the range from 0.1 to 30 wt % when the polyimide contains fluorine.

These characteristics of polyimide will now be described in more detail.

① Inherent viscosity

The inherent viscosity of the polyimide measured at a concentration 0.5 g/dl at a temperature of 30° C. using N-methyl-2-pyrrolidone (hereinafter abbreviated as NMP from time to time) as a solvent is preferably in the range from 0.05 to 10 dl/g.

If the inherent viscosity is less than 0.05 dl/g, the molecular weight may be too small and the heat resistance (thermal decomposition temperature) tends to be decreased. In addition, the film forming capability tends to be impaired, resulting in poor coating-ability. On the other hand, polyimide having a inherent viscosity exceeding 10 dl/g is a macromolecule compound which tends to exhibit reduced processability and usability.

Therefore, from the view point of balanced heat resistance and processability, a more preferred range of the inherent viscosity of the polyimide is from 0.1 to 4 dl/g.

② Glass transition temperature (Tg)

It is desirable that the glass transition temperature of the polyimide be 230° C. or higher, and more preferably in the range from 240 to 600° C. If the glass transition temperature of the polyimide is less than 230° C., heat distortion tends to occur when the material is processed at a high temperature (for example, in a process requiring solder resistance). The glass transition temperature of polyimide is determined from transition points of the specific heat of polyimide which are measured using a DSC (Differential Scanning Calorimeter) apparatus.

③ 5 wt % thermal decomposition temperature

It is desirable that the polyimide have a 5 wt % thermal decomposition temperature of 400° C. or more, particularly preferably 430° C. or more. If the 5 wt % thermal decomposition temperature of the polyimide is less than 400° C., cracking gas tends to be produced during processing at a high temperature such as for soldering. In addition, peeling and swelling of solder may occur in the soldered portions. The polyimide may decompose during wiring operations under high temperature conditions (usually at a temperature of 400° C. or higher).

The 5 wt % thermal decomposition temperature of polyimide is measured by heating the polyimide at a rate of 10° C./minute in nitrogen using TGA. The 5 wt % thermal decomposition temperature is defined as the temperature at which the weight of a measured sample decreases 5 wt %, that is, the weight of the sample becomes 95 wt % during heating, assuming the weight of the measured sample at the start of measurement to be 100 wt %.

④ Specific dielectric constant (1 MHz)

It is desirable that the specific dielectric constant (at a frequency of 1 MHz) of the polyimide be 2.9 or less, more preferably 2.8 or less, with a specific dielectric constant of 2.70 being ideal. A specific dielectric constant for the polyimide of more than 2.9 is undesirable because of poor electrical insulation properties against high frequencies. For example, problems due to low dielectric properties such as problems relating to retarded wiring operation and heat generation cannot be solved.

The specific dielectric constant ($\epsilon$) is determined as follows. Specifically, a polyimide sample is inserted between electrodes of a dielectric constant measuring instrument to measure the electrostatic capacity of the polyimide by applying a high frequency of 1 MHz. The specific dielectric constant ($\epsilon$) is calculated from the following formula:

$$\epsilon = C \times d / (\epsilon_0 \times S)$$

wherein C is the electrostatic capacity, d is the thickness of the polyimide sample, $\epsilon_0$ is a dielectric constant under vacuum, and S denotes the electrode area.

⑤ Volume resistivity

The volume resistivity of the polyimide is preferably $1 \times 10^{15}$ or more, and more preferably $1 \times 10^{16}$ or more.

If the volume resistivity of the polyimide is less than $1 \times 10^{15}$, the electrical insulation properties may be poor so that the product is not suitable for use as an electrical part.

The volume resistivity of polyimide is measured by inserting a polyimide sample between electrodes of a volumetric resistance meter and applying a high voltage of 100V for 30 seconds.

⑥ Fluorine content

When the polyimide contains fluorine (hereinafter called a fluorine-containing polyimide), the fluorine content (hereinafter called a fluorine atom content) is preferably in the range from 0.1 to 30 wt %. The specific dielectric constant tends to increase if the fluorine atom content is less than 0.1 wt %. On the other hand, when the fluorine atom content is more than 30 wt %, not only is the heat resistance of the polyimide impaired, but also fluorine gas or hydrogen fluroride gas tend to be generated during heating. Moreover, processability such as adhesion and coating-ability to substrates (lamination surfaces) of electronic parts tends to be impaired.

Therefore, in view of the balance between the value of specific dielectric constant and heat resistance of the fluorine-containing polyimide, the fluorine-atom content in the fluorine-containing polyimide resin should be in the range from 1 to 25 wt %.

The fluorine atom content in the polyimide is measured by NMR using benzotrifluoride as a standard material.

(5) Form of polyimide

There are no specific limitations to the form of polyimide as an electric insulating material in the electronic parts of the present invention. The polyimide may be used, for instance, as an insulating film between wiring layers inside a semiconductor apparatus or a multi chip module (MCM), as an electric insulating film such as an insulating film for capacitors, as a flattening film to flatten wiring multilayers, a surface protective coat for wiring, and as a substrate for flexible circuits. Accordingly, the polyimide may be in any form such as a film, a sheet, solid pellets, or a paste. Because the electronic parts of the present invention have a low specific dielectric constant, these parts are particularly suitable for use as a thin film such as an insulating film between layers and a flattening film requiring low dielectric properties.

It is preferable that the electronic parts of the present invention contain at least 5 wt % of the polyimide in the total 100 wt % of the composition. If the content of polyimide is less than 5 wt %, the specific dielectric constant may become large and the heat resistance tends to decrease. To ensure an excellent dielectric constant and heat resistance, the content of polyimide should be 10 wt % or more, and preferably 50 wt % or more.

① Insulating film between semiconductor layers (layer insulating film)

Silicon substrates with semiconductor ICs mounted thereon and semiconductor substrates such as metal plates or ceramic plates are coated with protective coatings such as a silicon oxide film, except for specific circuit parts. Conductor layers for wiring consisting of aluminum or the like are formed on the exposed circuit portions.

A polyimide solution is coated on the semiconductor substrate on which these conductor layers (wiring) are formed by a spinning method (roll coating method) or the like. Then, the solvent is removed by a heat treatment to produce a polyimide film as an insulating film between the layers.

Via hole may be provided or separate wiring may be formed over the insulating film according to conventional methods, thereby producing a multilayer structure of a semiconductor integrated circuit.

② Flattening film for semiconductors

When semiconductor ICs with a multilayer structure are produced, flattening films are frequently formed between the wires which are positioned in the vertical direction, in order to uniformly form the respective wires in the vertical direction. Specifically, as mentioned above, a flattening film with a uniform thickness is formed over the layer insulating films between the wires. Then, a part of the surface of this flattening film is ground to produce a flat and smooth surface. Other wiring with a uniform thickness can be provided on this flattening film. Moreover, superb electrical insulation between the wires in the vertical direction can be ensured by providing these flattening films.

The polyimide for electronic parts of the present invention is suitable for use as a flattening film due to its low dielectric constant, superior heat resistance, and capability of producing thin films.

③ Multilayer flexible circuit board

The fluorine-containing polyimide solution (varnish) of the present invention is continuously applied to a stainless belt, for example, using a T die or the like. Next, the solvent contained in the fluorine-containing polyimide solution is evaporated under prescribed heat treatment conditions (usually at a temperature from 200 to 300° C.) to produce a film (usually with a film thickness of 2 to 100 $\mu$m) of the fluorine-containing polyimide resin.

Then, copper is deposited over the fluorine-containing polyimide film using a dry process, for example, by a sputtering technique under vacuum conditions, or in a plating bath by means of a wet process, thereby producing a copper-laminated flexible substrate.

Next, the fluorine-containing polyimide solution is again laminated on the copper-laminated flexible substrate to produce a polyimide film. A multilayer flexible circuit board can be manufactured in this manner.

The above-mentioned polyimide is an ideal material for manufacturing the multilayer flexible substrates requiring low dielectric properties.

2. Process for manufacturing electronic parts

The process for manufacturing the electronic parts of the present invention includes the following steps (A) to (C).

(A) A step for preparing polyimide solution containing a recurring unit represented by the above-mentioned general formula (1).

(B) a step for applying the polyimide solution on a substrate.

(C) a step for forming an electric insulating material by drying the polyimide solution.

① Step (A)

First, the polyamic acid having the repeating unit shown by the above-mentioned general formula (2) is prepared by reacting the above-mentioned aromatic diamine compound and aromatic tetracarboxylic acid dianhydride compound in the solvent.

Secondly, a heat imidation method or a chemical imidation method is used for imidation of the polyamic acid to produce the polyimide (polyimide solution) containing a recurring unit represented by the above-mentioned general formula (1).

As the heat imidation method, a method of heating the polyamic solution as is can be employed. The same organic solvents which are used for the preparation of polyamic acid can be used as the solvent for preparing the polyamic solution.

When the heat imidation method is used, a polyimide powder or solution can be obtained by heating the polyamic solution. A heating temperature in the range usually from 80 to 300° C., preferably from 100 to 200° C., is applied.

For ease of removal of by-produced water, the heat imidation method can be carried out in the presence of a dehydration agent which may be a component being capable of azeotropically distilled with water and separated from water when removed from the system. Aromatic hydrocarbon such as benzene, toluene, and xylene are given as examples of as such the dehydration agents. In addition, a tertiary amine may be used as a catalyst to accelerate a dehydration-cyclization reaction in the heat imidation method. Such a tertiary amine used as the catalyst includes aliphatic tertiary amines such as trimethylamine, triethylameine, tri-n-propylamine, tri-i-propylamine, and tri-n-butylamine; aromatic tertiary amines such as N,N-dimethylaniline and N,N-diethylaniline; and heterocyclic tertiary amines such as pyridine, quinoline, and isoquinoline. There are no specific limitations to the amount of the catalyst used. Usually, an amount in the range from 10 to 400 parts by weight for 100 parts by weight of polyamic acid is applicable.

Describing now the chemical imidation method, the polyamic acid in a solution is dehydrated and cyclized in the presence of a cyclization agent into polyimide, to obtain polyimide in the form of a powder or a solution. The same organic solvent as given for the preparation of polyamic acid can be used as a solvent in this method.

Acid anhydrides such as acetic anhydride, propionic anhydride, and lactic anhydride are given as cyclization agents used in the chemical imidation method. These cyclization agents may be used either individually or in combinations of two or more. There are no specific limitations to the amount of the cyclization agent used. Usually, an amount in the range from 2 to 100 mols, preferably from 2 to 50 mols, for one mole of the recurring unit represented by the general formula (2).

The reaction temperature in the range from 0 to 200° C. is used in the chemical imidation reaction. The same tertiary amines as used in the heat imidation method can be used as a catalyst also in the chemical imidation method.

It is desirable to remove the catalysts and cyclization agents used in either the heat or chemical imidation methods. Specifically, the solvent can be removed by a method of condensing the resultant polyimide solution, a method of extracting with a liquid which is immiscible with the solvent used in the imidation reaction, or a method of adding the polyimide solution to a poor solvent for the polyimide to recover the polyimide as a powder, followed by redissolving the powder in a solvent.

Moreover, in the step (A), diamine compounds and acid anhydride compounds other than the above-mentioned aromatic diamine compounds and aromatic tetracarboxylic acid dianhydride compounds may be added to control the reaction rate and to adjust the properties of the resulting polyimide compounds.

The product obtained by the step (A) include a large amount of polyamic acid as a precursor of the polyimide. Accordingly, the polyimide solution obtained after completion of the step (A) is sometimes called a polyamic acid solution.

The reaction for the synthesis of the polyimide is preferably carried out in the presence of at least one solvent selected from the group consisting of N-methylpyrrolidone, N,N-dimethylformamide, N,N-dimethylacetamide, γ-butyrolactone, ethyl lactate, methoxy methylpropionate, propylene glycol monomethyl ether acetate, and cyclohexanone.

These solvents are good solvents for a polyimide comprising polyamic acid. In addition, the polyimide synthesized in a solvent can be used for the manufacture of electronic parts as the polyimide solution as is. Therefore, synthesis of polyimide using these solvents is desirable also from the viewpoint of ensuring process advantage.

Also, the compounds conventionally used in the synthesis of polyimide, such as N-methylmethoxyacetamide, N-dimethylmethoxyacetamide, N-diethylmethoxyacetamide, N-methylcaprolactam, 1,2-dimethoxyethane, diethylene glycol dimethyl ether, tetrahydrofuran, 1,3-dioxane, 1,4-dioxane, pyridine, picoline, dimethylsulfone, and tetramethyl urea, may be used either individually or in combination with the above-mentioned solvents.

Moreover, it is desirable to add at least one of the above-described solvents to the polyimide (which may contain polyamic acid) after the synthesis. In this instance, the amount of solvent added is preferably in the range from 150 to 3000 parts by weight for 100 parts by weight of the polyimide. The addition of the solvent in this range ensures not only production of a polyimide solution possessing a suitable viscosity, but also easy operations such as drying.

From the viewpoint of obtaining a dense and thin film, the viscosity of the polyimide solution obtained by blending the solvent should be in the range from 10 to 100,000 cps (measured at 25° C.), and more preferably from 100 to 5,000 cps.

② Step (B)

Lamination(applying) of the polyimide solution on a substrate can be carried out according to conventional methods under commonly employed conditions without any specific limitations, provided that use of a spin coater or the like to uniformly laminate layers of the polyimide solution is desirable for forming an layer insulating film, flattening film, or capacitor insulating film in a semiconductor apparatus.

In step(B), polyamic acid solution can be used in stead of polyimide solution. In this case, imidation is done in step (C).

③ Step (C)

Drying of laminated layers of the polyimide solution to form electric insulating films consisting of polyimide can be carried out according to a conventional method under commonly employed conditions. Specifically, the polyimide solution containing polyamic acid is dried by means of a heat imidation method to ultimately form an layer insulating film, flattening film, or capacitor insulating film in a semiconductor apparatus. Heating at the temperature range of 100 to 400° C. is preferred.

In the case where a chemical imidation method is used to form these thin films, it is desirable to add a cyclization agent to a polyimide solution before treating the solution at 0–200° C.

Other features of the invention will become apparent in the course of the following description of the exemplary embodiments which are given for illustration of the invention and are not intended to be limiting thereof.

EXAMPLES

Example 1

(Synthesis of polyimide)

276.8 g of N,N-dimethylformamide was placed into a reaction vessel equipped with a stirrer, a reflux condenser, and a nitrogen introduction tube and thoroughly dissolved in 26.633 g (50 mmol) of 9,9-bis[4-(4-aminophenoxy)phenyl]fluorene. After the addition of 22.213 g (50 mmol) of 2,2-bis(3,4-dicarboxyphenyl)-1,1,1,3,3,3-hexafluoropropane dianhydride, the mixture was agitated at room temperature for 5 hours using a stirrer to produce a fluorine-containing polyamic acid solution. The inherent viscosity of this fluorine-containing polyamic acid solution was measured using N,N-dimethylformamide as a solvent at 30° C. at a concentration of 0.5 g/dl, to confirm that the inherent viscosity was an appropriate value of 0.80 dl/g. Also, the obtained solution was measured by FT-IR method as shown in FIG. 1.

Then, 80 ml of xylene was added to this fluorine-containing polyamic acid solution and the mixture was heated for 3 hours while refluxing at a temperature of 200° C., thereby producing a fluorine-containing polyimide solution from fluorine-containing polyamic acid. Water produced by the polycondensation reaction was removed by azeotropic distillation.

After confirming removal of water, excessive xylene was removed from the fluorine-containing polyimide solution by distillation.

Figure 2:
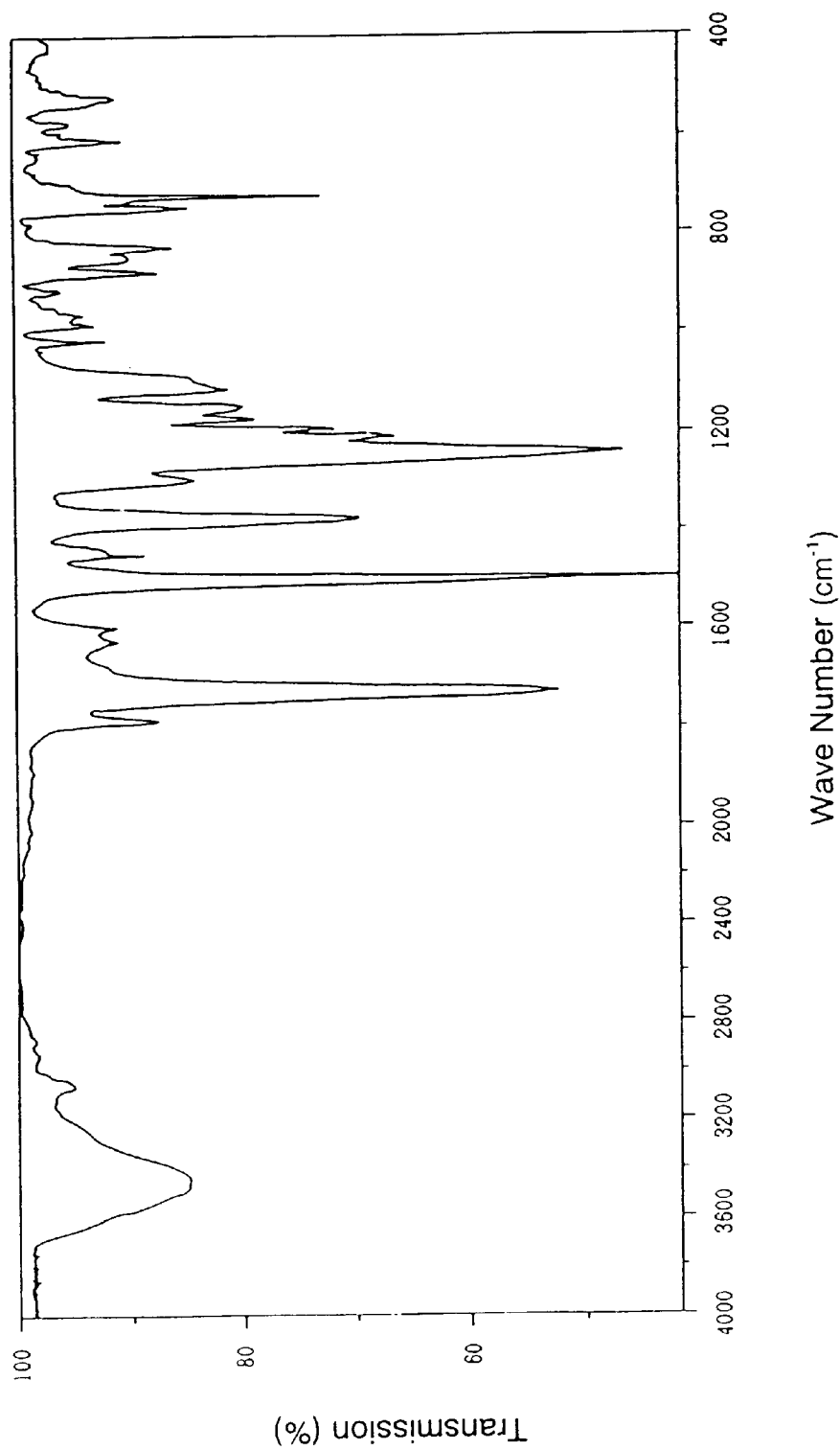
FIG. 2 is an IR chart of the polyimide resin produced in the Example 1.
Figure 3:
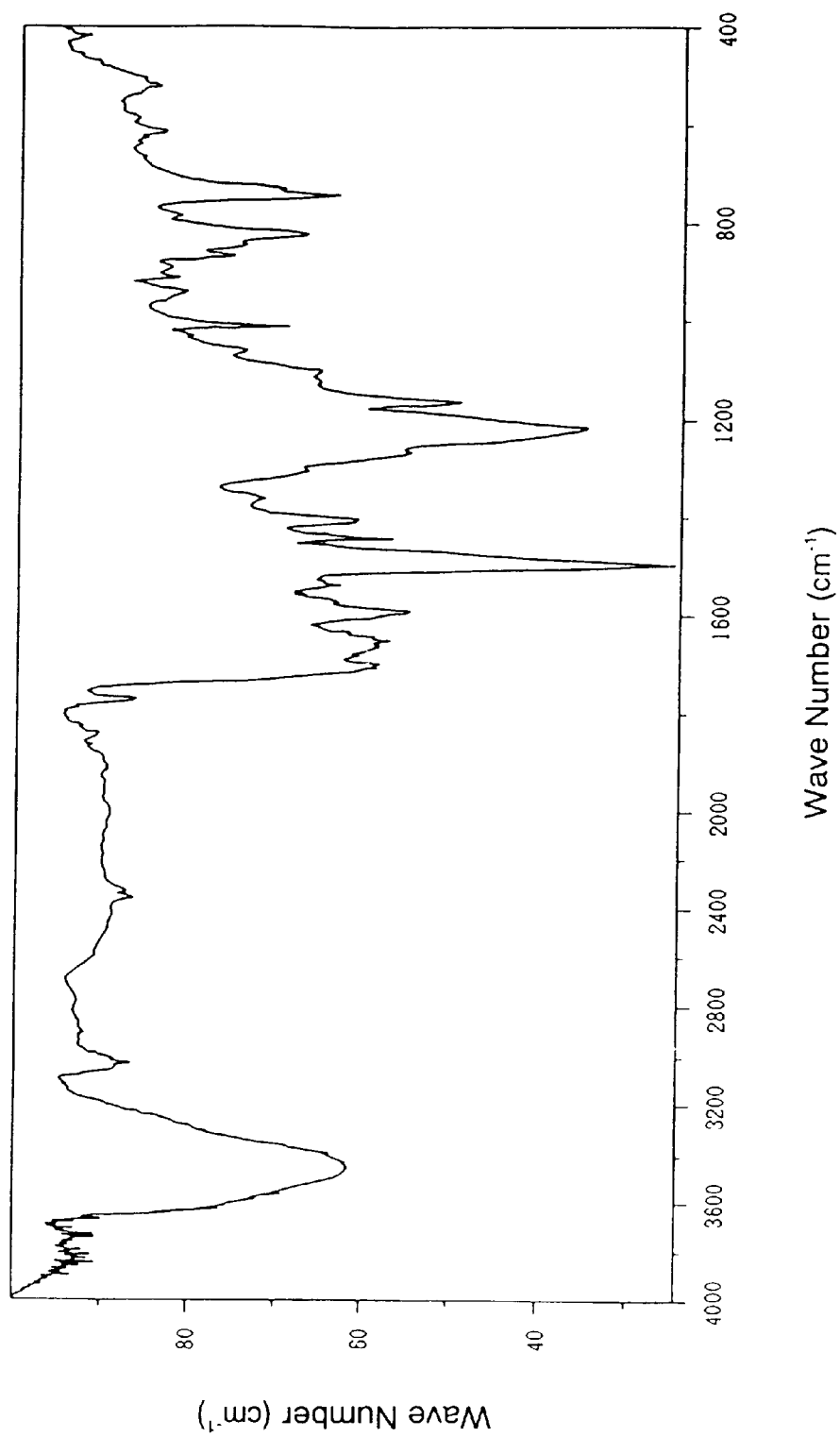
FIG. 3 is an IR chart of the polyamic acid produced in the Example 2.
Figure 4:
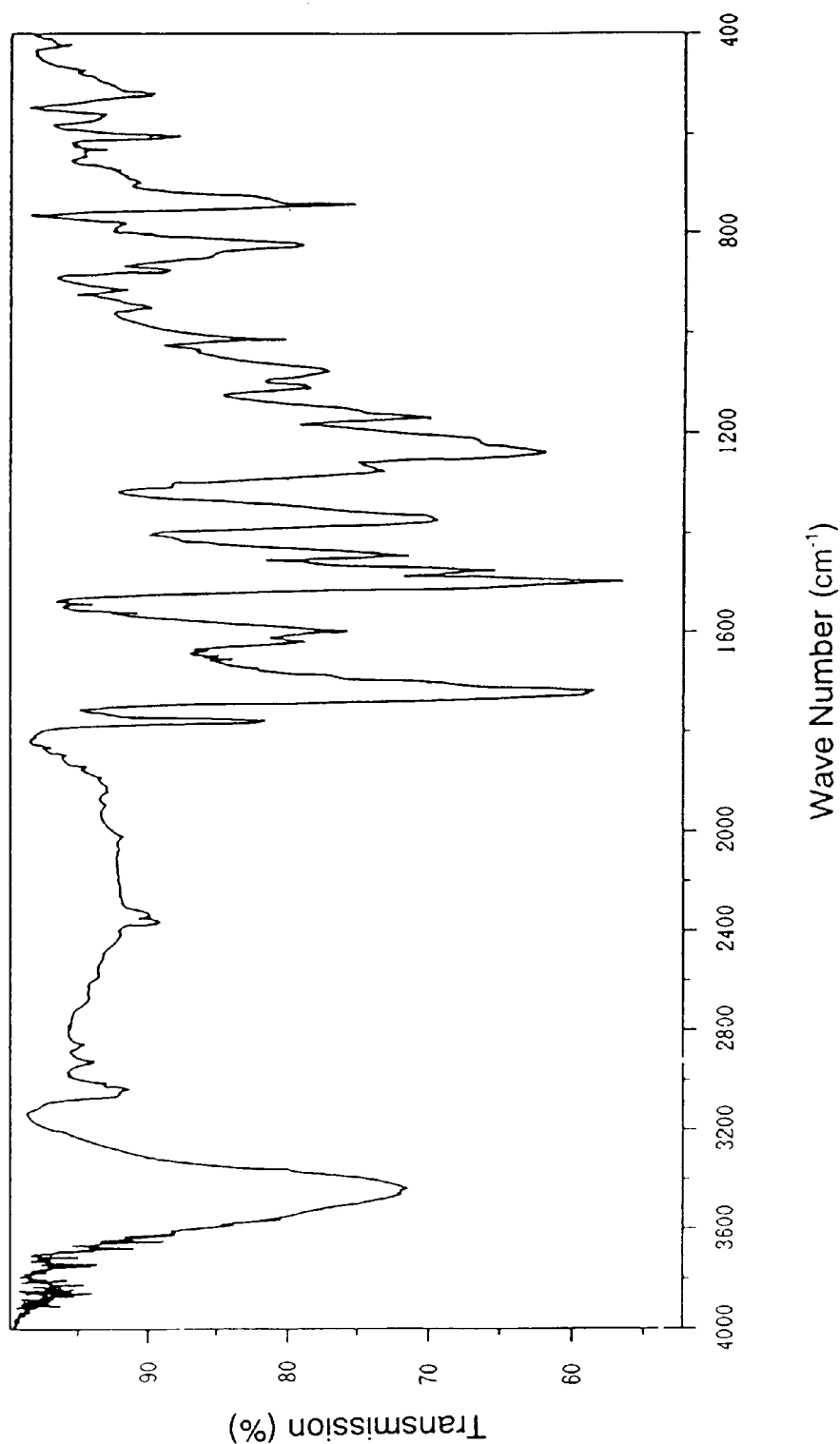
FIG. 4 is an IR chart of the polyimide resin produced in the Example 2.
Figure 5:
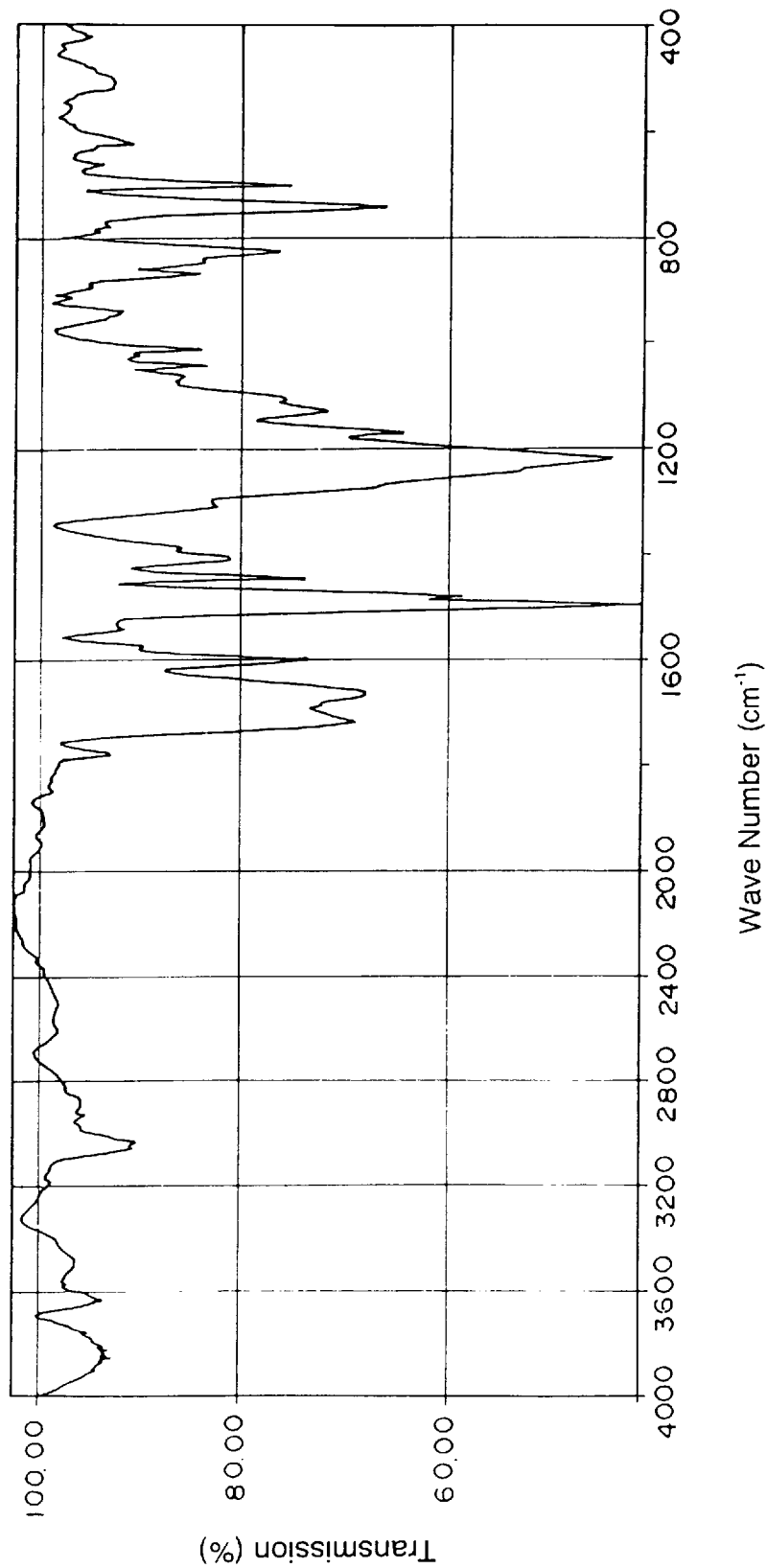
FIG. 5 is an IR chart of the polyamic acid produced in the Example 3.
Figure 6:
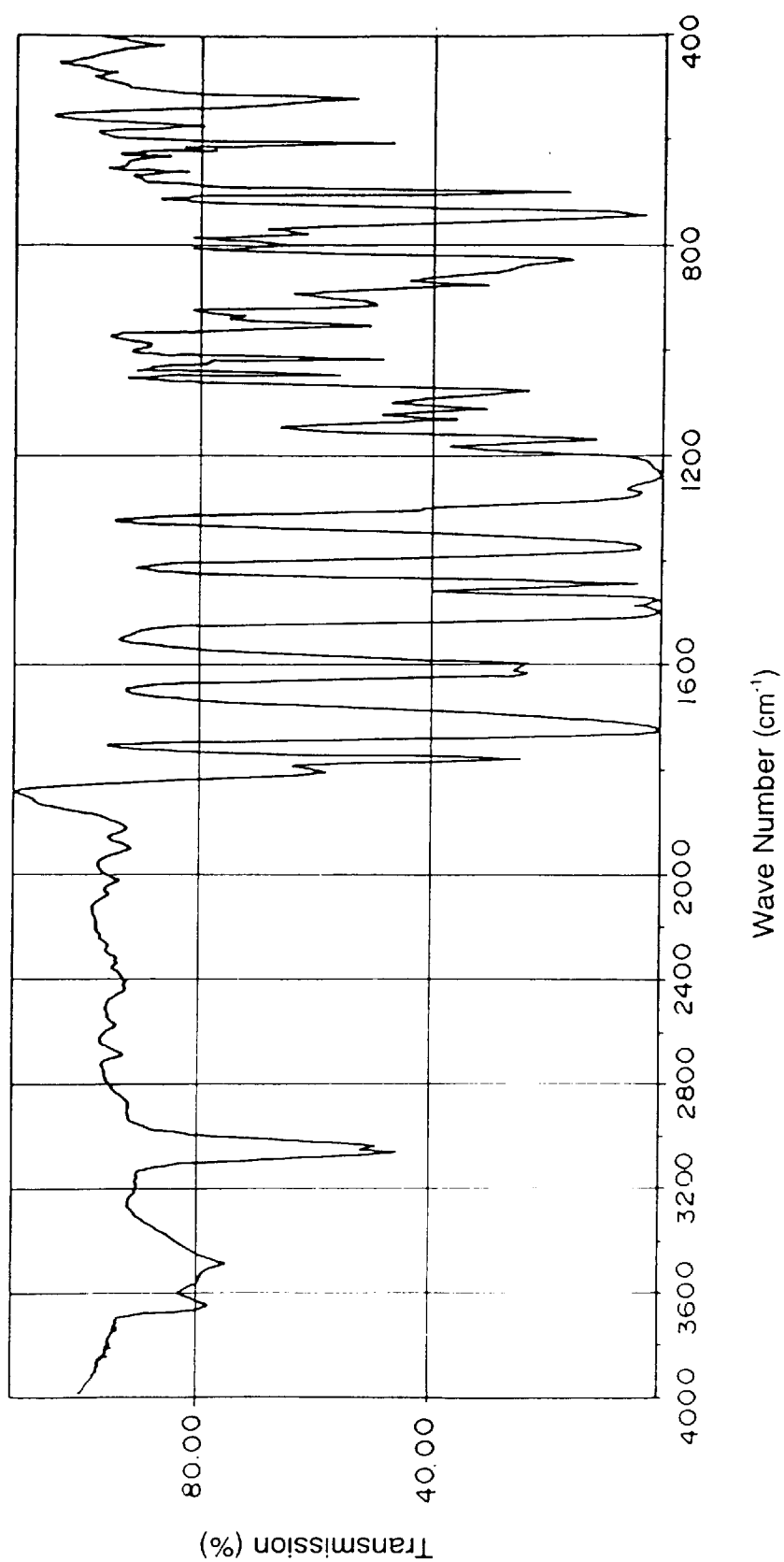
FIG. 6 is an IR chart of the polyimide resin produced in the Example 3.
Figure 7:
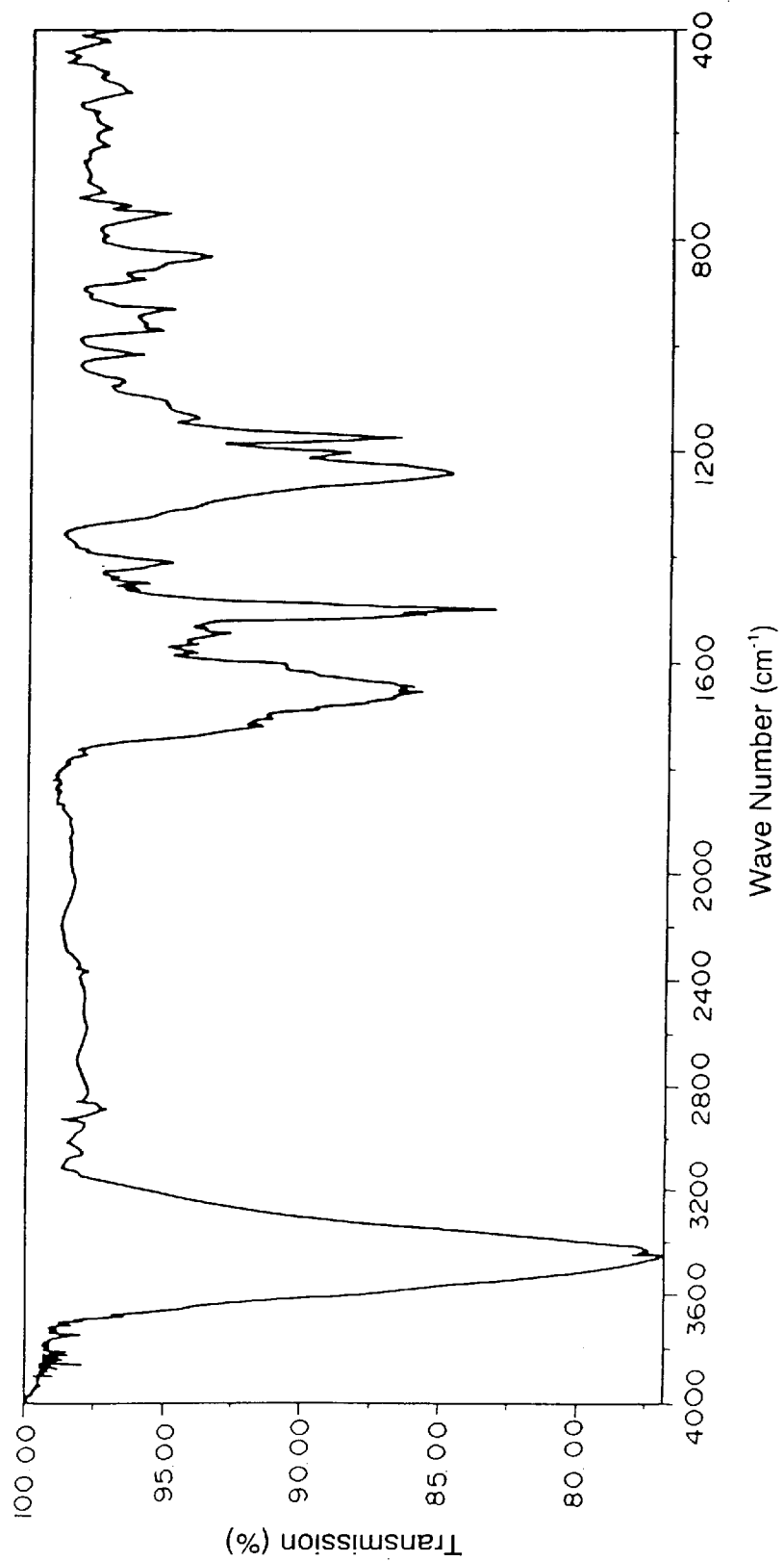
FIG. 7 is an IR chart of the polyamic acid produced in the Example 4.
Figure 8:
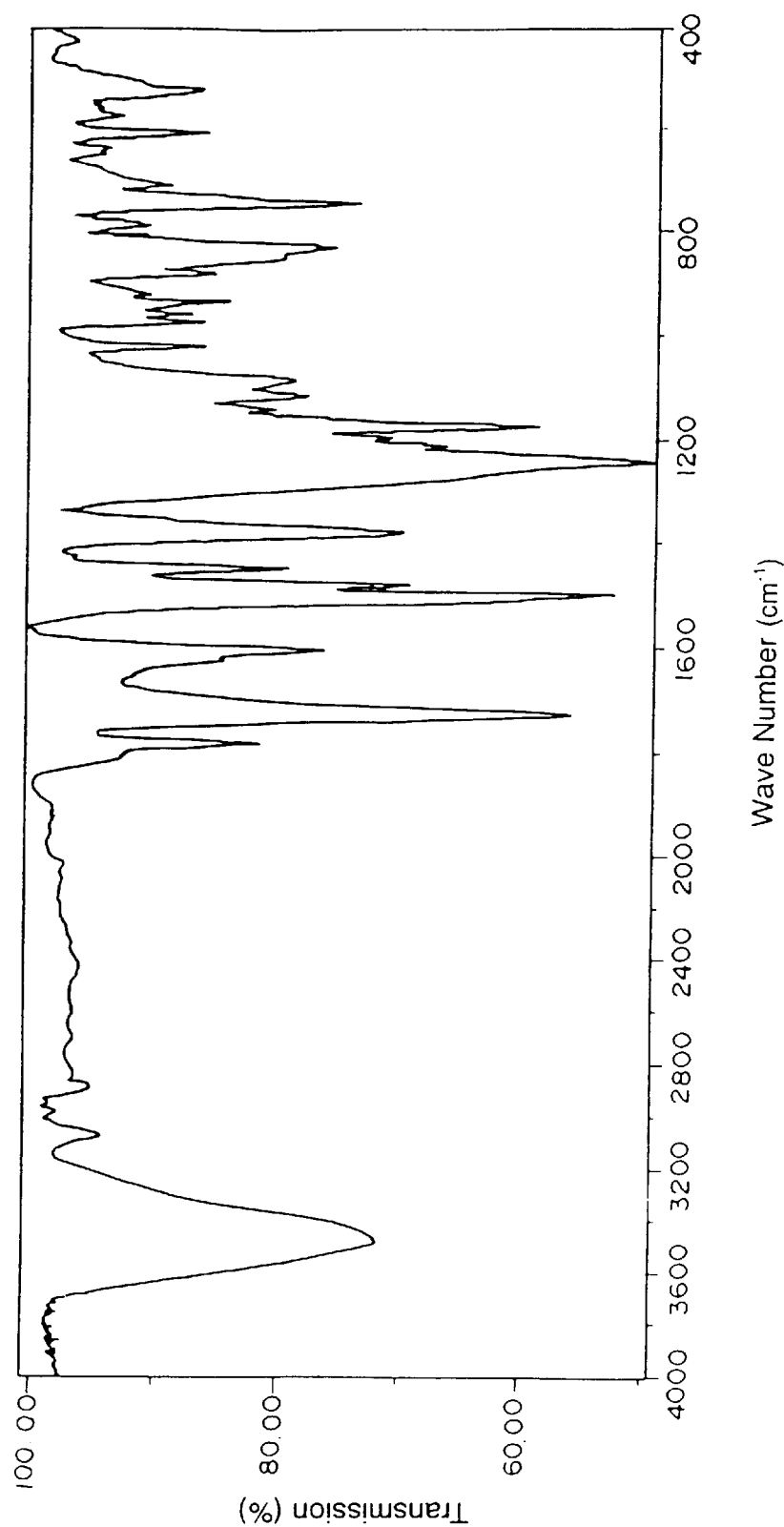
FIG. 8 is an IR chart of the polyimide resin produced in the Example 4.
Figure 9:
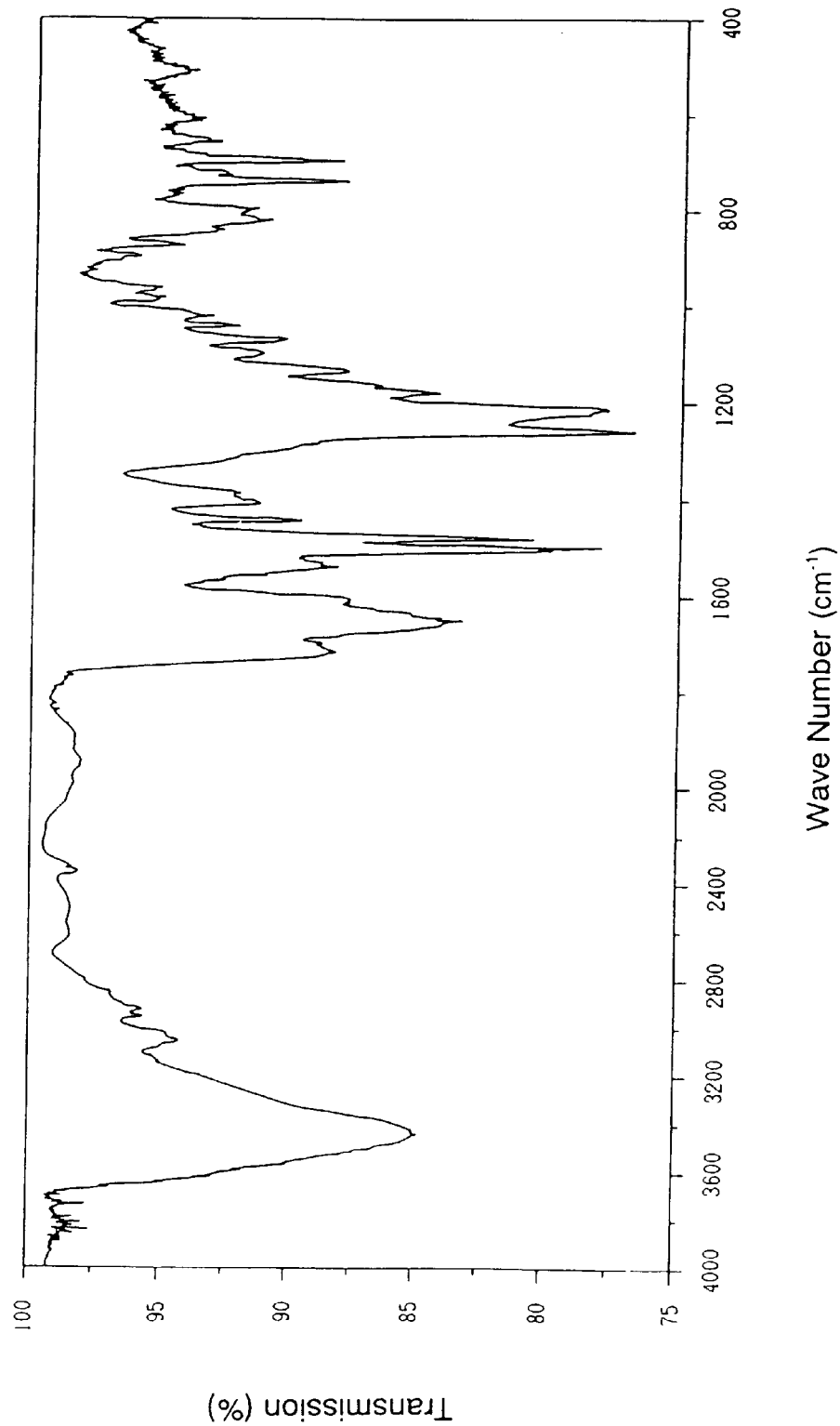
FIG. 9 is an IR chart of the polyamic acid produced in the Example 5.
Figure 10:
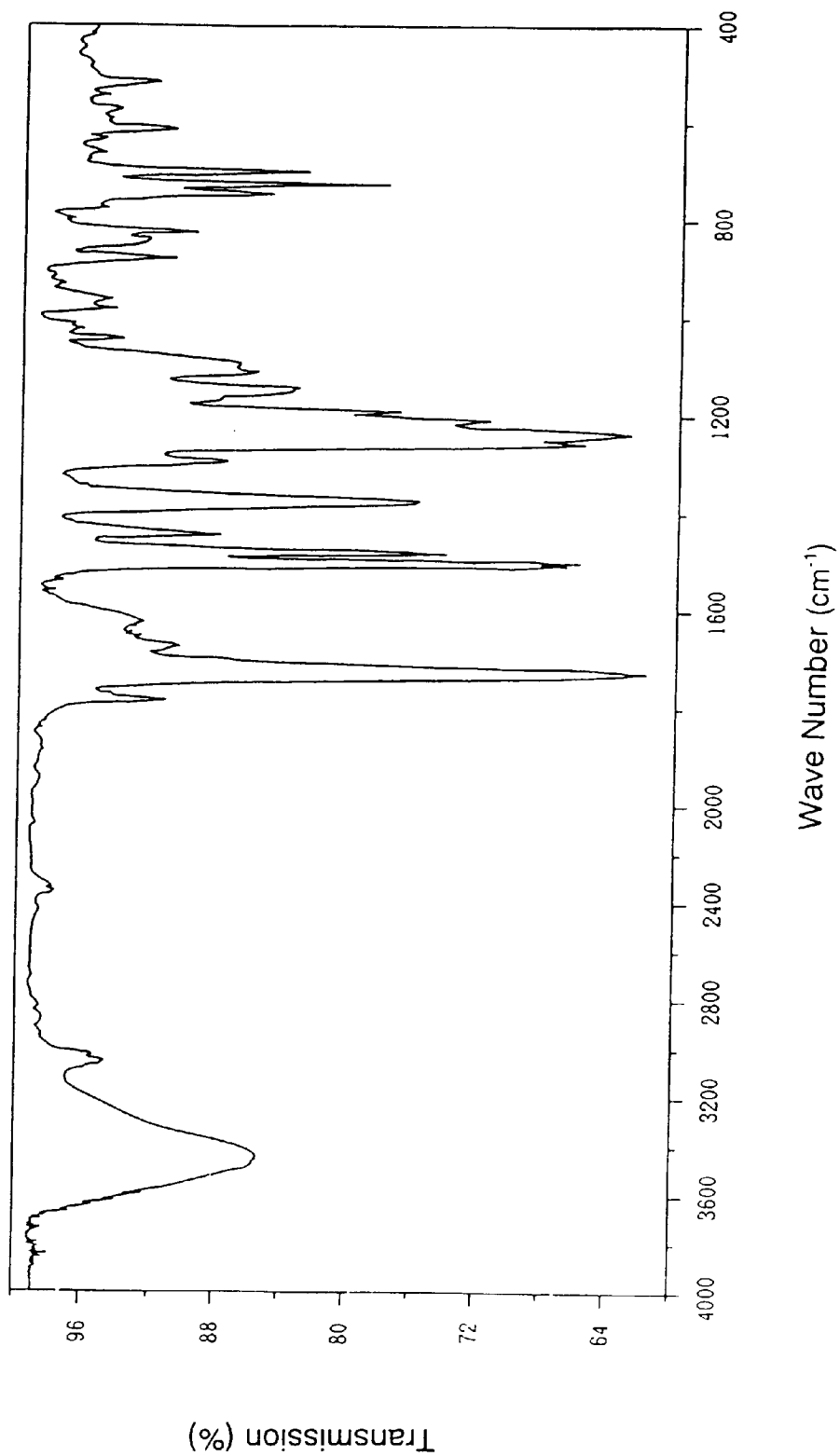
FIG. 10 is an IR chart of the polyimide resin produced in the Example 5.
Figure 11:
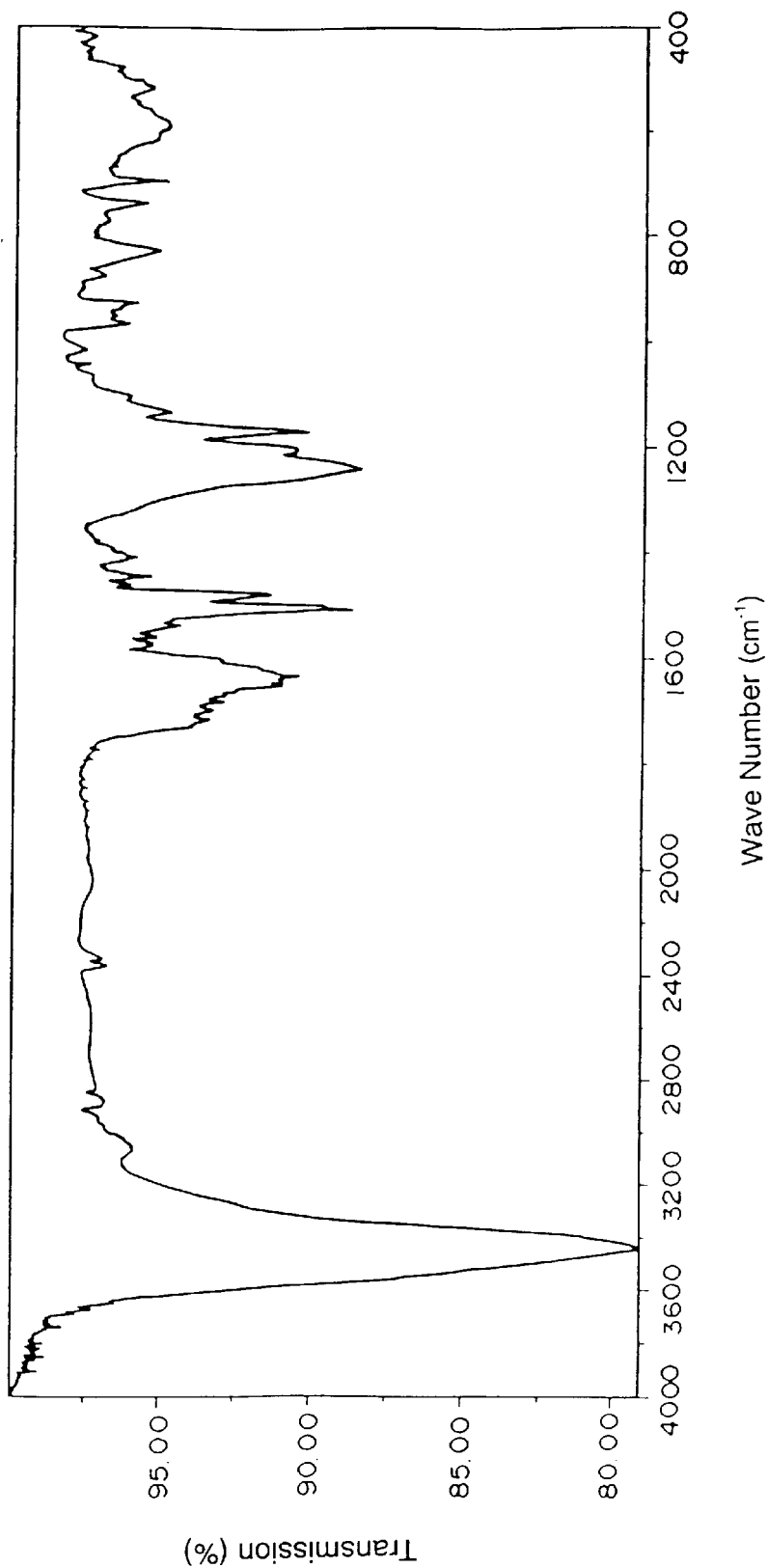
FIG. 11 is an IR chart of the polyamic acid produced in the Example 6.
Figure 12:
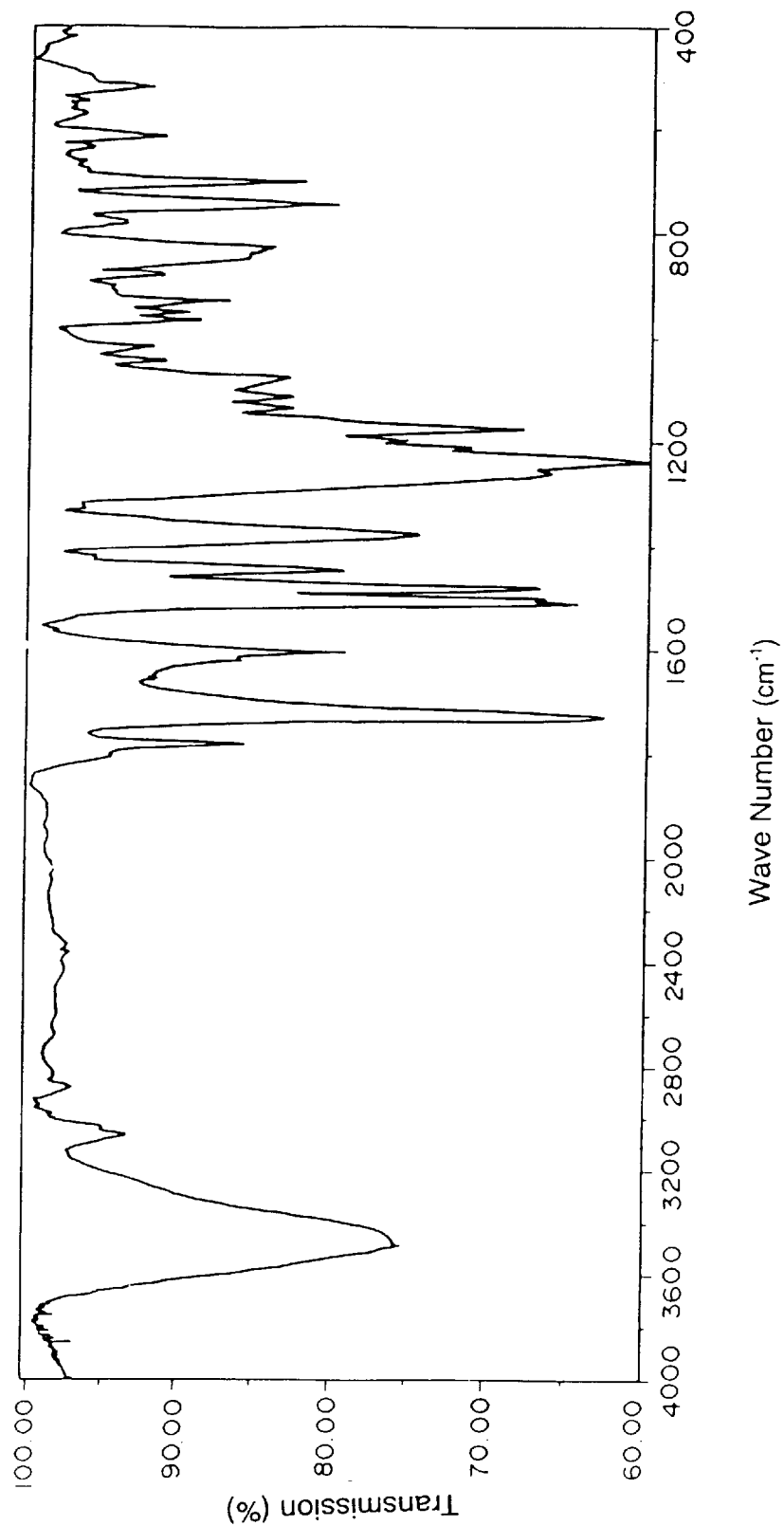
FIG. 12 is an IR chart of the polyimide resin produced in the Example 6.
Figure 13:
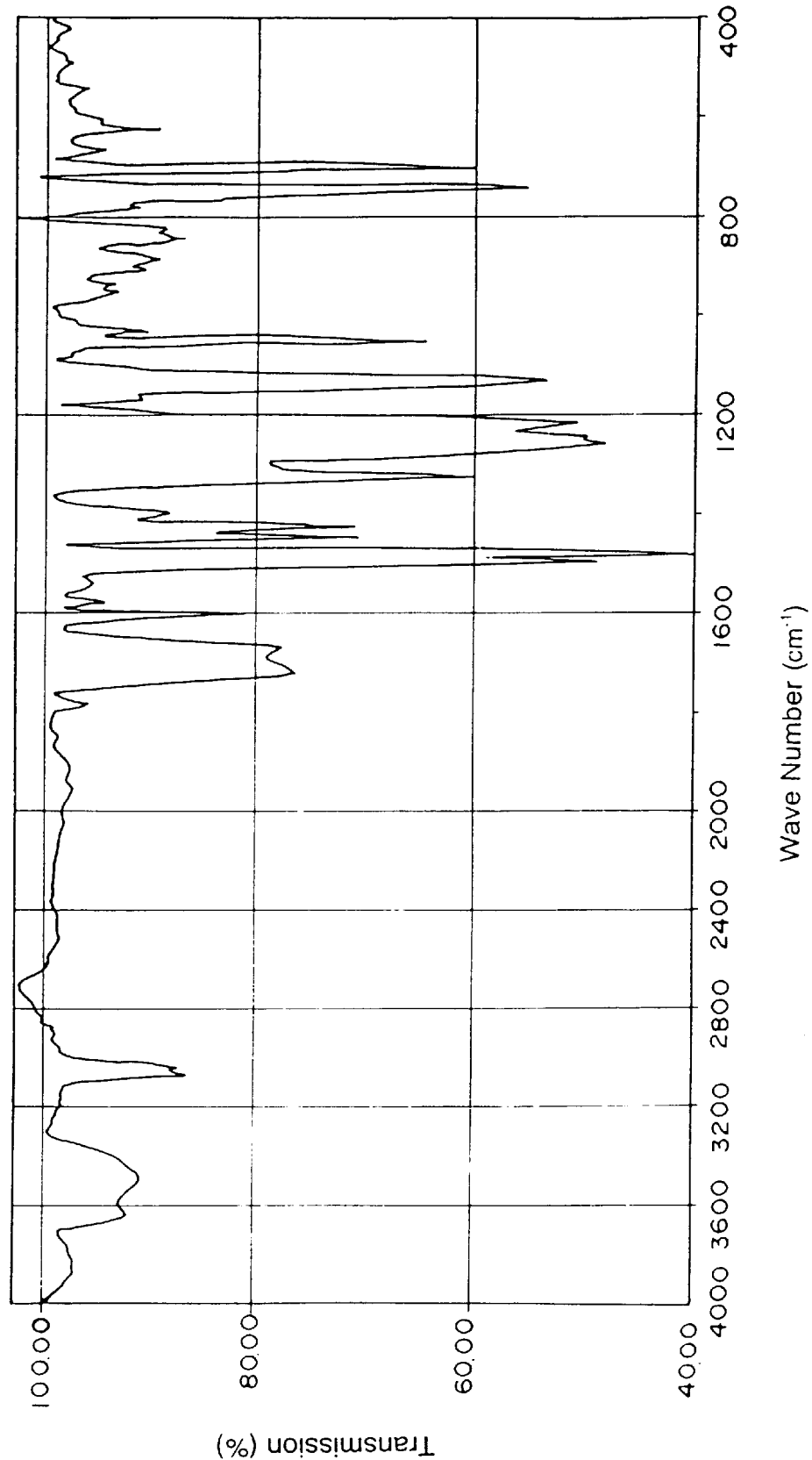
FIG. 13 is an IR chart of the polyamic acid produced in the Example 8.
Figure 14:
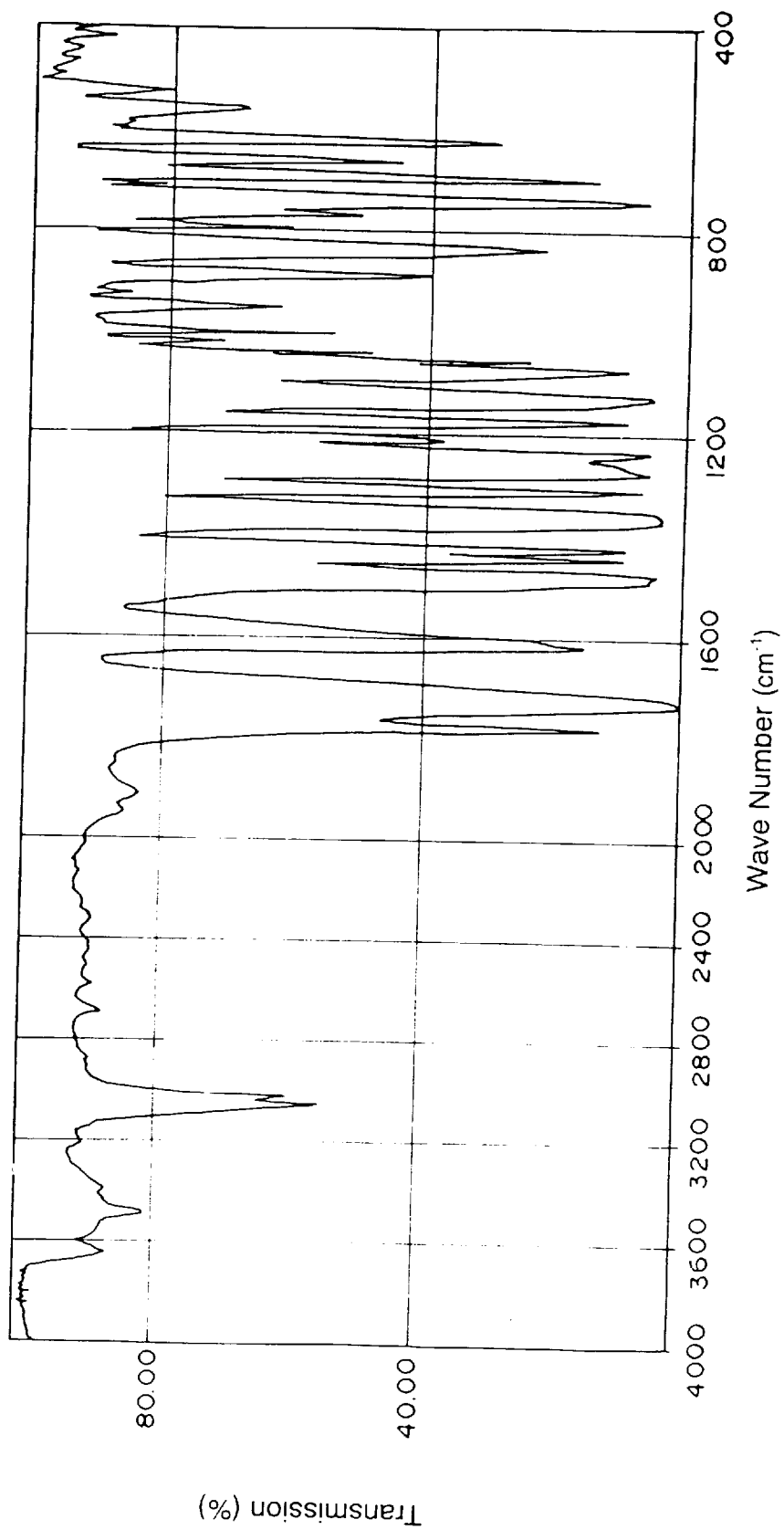
FIG. 14 is an IR chart of the polyimide resin produced in the Example 8.
Figure 15:
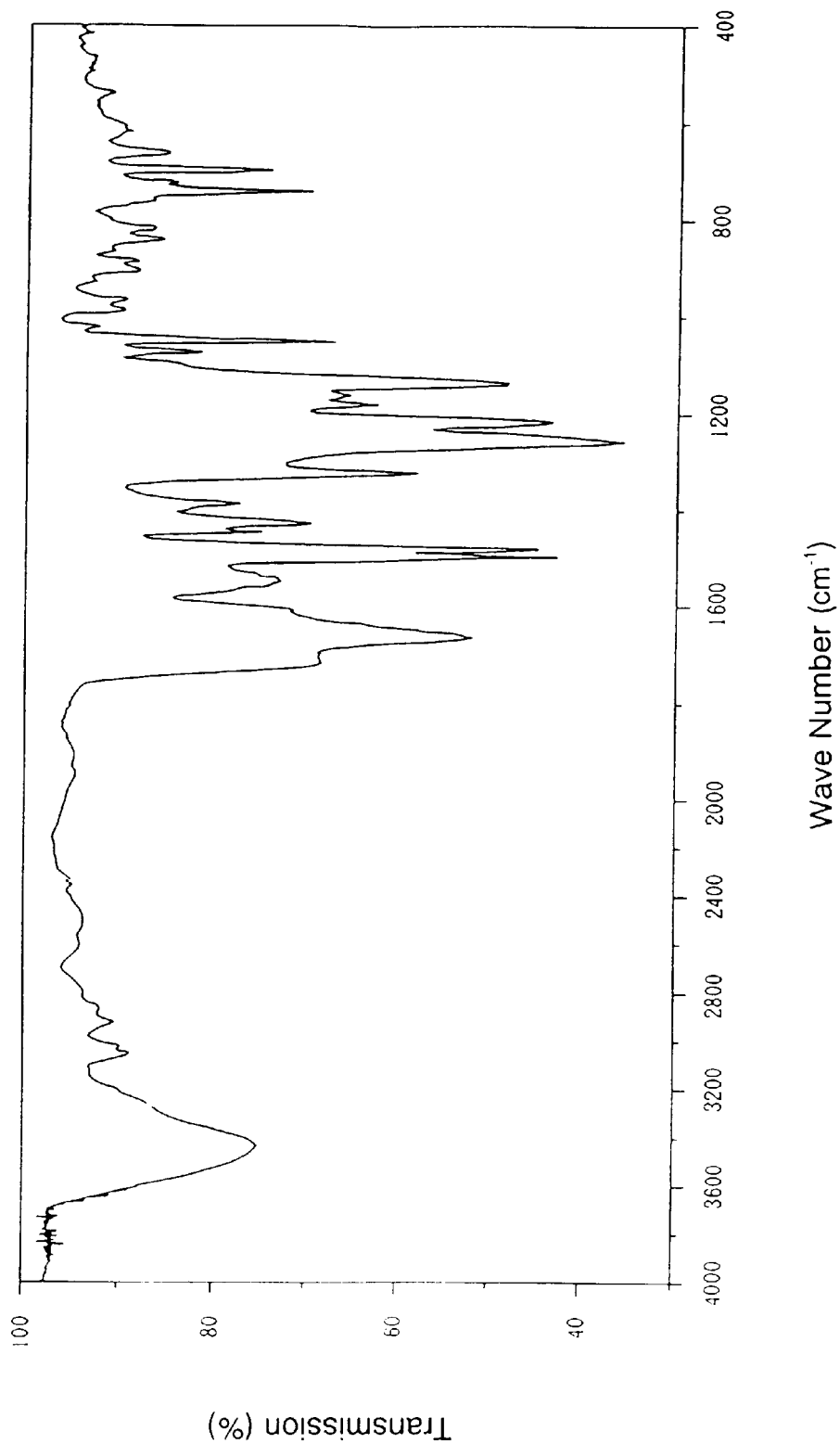
FIG. 15 is an IR chart of the polyamic acid produced in the Example 9.
Figure 16:
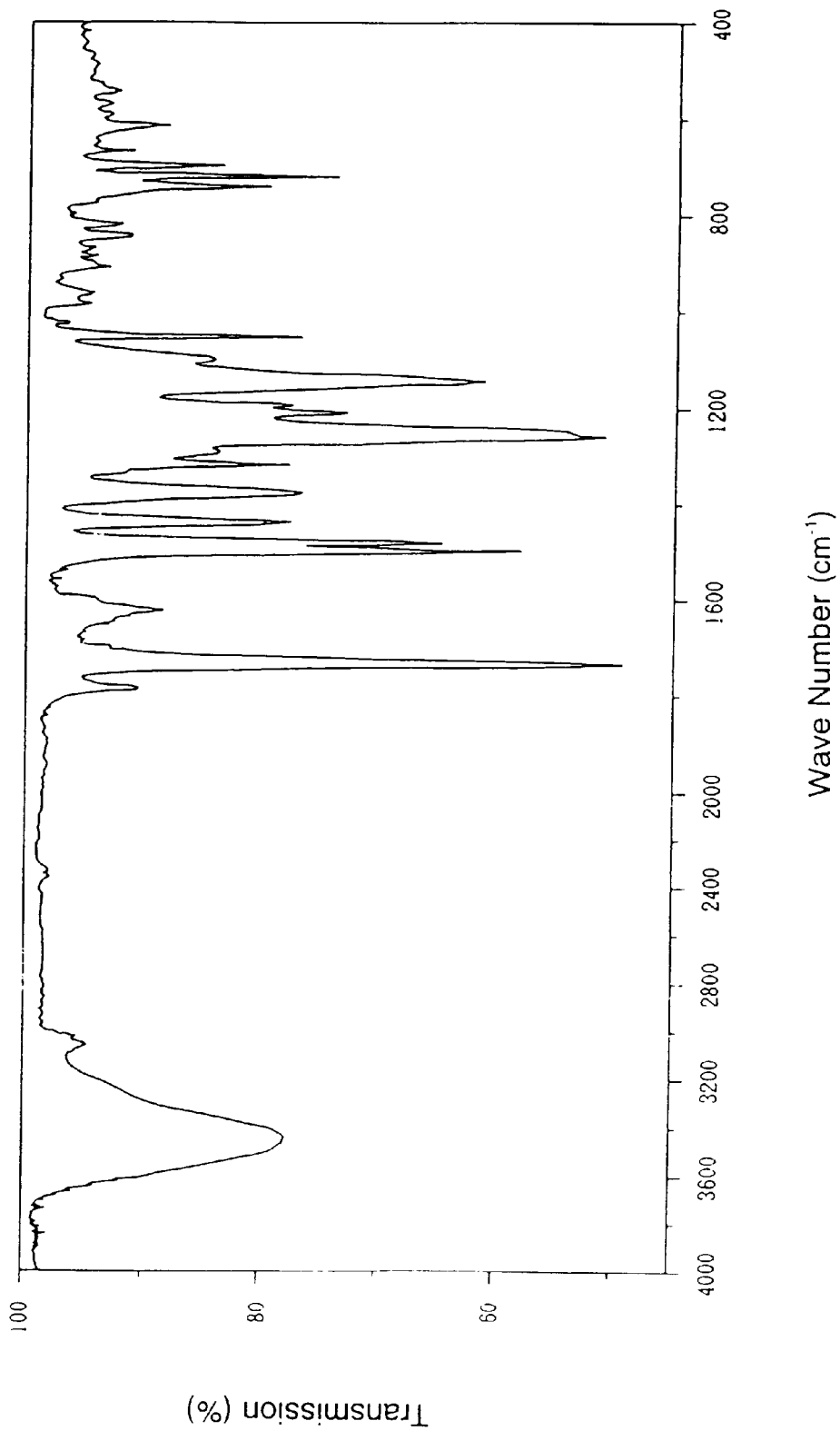
FIG. 16 is an IR chart of the polyimide resin produced in the Example 9.
Figure 17:
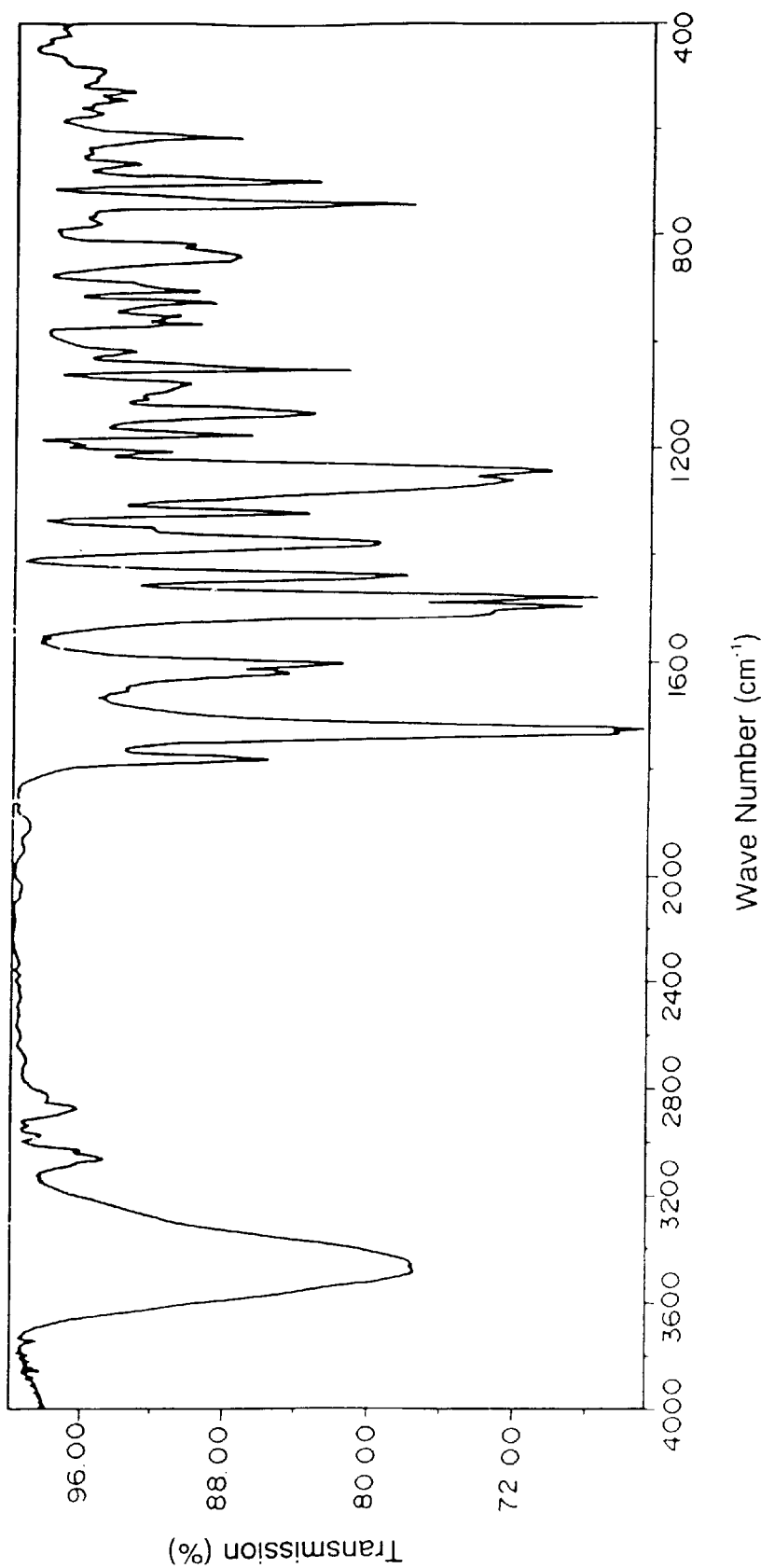
FIG. 17 is an IR chart of the polyimide resin produced in the Example 10.

N,N-dimethylformamide was again added as a solvent to obtain a fluorine-containing polyimide solution with a replaced solvent. The inherent viscosity of this polyimide solution was measured using N,N-dimethylformamide as a solvent at 30° C. at a concentration of 0.5 g/dl, to confirm that the inherent viscosity was an appropriate value of 0.81 dl/g. Production of a high polymer was thus confirmed. Also, the obtained polymer was measured by FT-IR method as shown in FIG. 2.

(Solubility of polyimide in solvent)

N,N-dimethylformamide was added to the resulting solution of fluorine-containing polyimide to adjust the concentration of polyimide to 3 wt %. This fluorine-containing polyimide solution with an adjusted polyimide concentration was charged into methanol of a 10-fold volume to precipitate polyimide. The precipitated polyimide was filtered and dried to obtain a polyimide powder. This powder was confirmed to be completely soluble in N-methylpyrrolidone. Dimethylformamide, dimethylacetamide, and γ-butyrolactone were used in place of N-methylpyrrolidone to confirm that the polyimide powder was completely soluble also in these solvents.

This solubility test of polyimide powder was also carried out for the polyimide powders obtained in Example 2–10 hereinafter to confirm that the polyimide powders obtained in these Examples are completely soluble in the organic solvents of N-methylpyrrolidone, dimethylformamide, dimethylacetamide, and γ-butyrolactone.

(Preparation of polyimide film)

Polyimide films of first, second, and third fluorine-containing polyimide resins were prepared from the fluorine-containing polyamic acid solution or the polyimide solution according to the following method.

(1) The fluorine-containing polyamic acid solution was applied to a SUS304 substrate by spin coating (rotation-coating method). The coated film was gradually heated from room temperature to 80° C., 140° C., 200° C., 250° C., and 300° C., while maintaining at each temperature for a duration of 20 minutes, to obtain a first polyimide film of fluorine-containing polyimide resin with a thickness of 11.2 μm.

(2) The fluorine-containing polyimide solution was applied to a SUS304 substrate by a spin coating (roll coating) method. The coated film was gradually heated from room temperature to 80° C., 140° C., and 200° C., while being maintained at each temperature for a duration of 20 minutes, to obtain a second polyimide film of fluorine-containing polyimide resin with a thickness of 30 μm.

(3) The fluorine-containing polyamic acid solution was cast over a glass plate and gradually heated to 80° C., 140° C., 200° C., 250° C., and 300° C., while being maintained at each temperature for a duration of 20 minutes, to obtain a third polyimide film of fluorine-containing polyimide resin with a thickness of 45 μm.

(Evaluation of polyimide films)

(1) Measurement of specific dielectric constant (ε)

A specimen for measuring the specific dielectric constant was prepared by producing a gold electrode by mask deposition on the first polyimide film. The specific dielectric constant (ε) was measured according to the following method using this specimen.

Specifically, the electrostatic capacity at 1 MHz of the polyimide film made of the fluorine-containing polyimide resin was measured using an LCR meter 4284A manufactured by Yokogawa-Hewlett-Packard, Ltd. The specific dielectric constant (ε) was determined by applying this electrostatic capacity to the previously described formula.

As a result, the specific dielectric constant for the first polyimide film made of the fluorine-containing polyimide resin was confirmed to be a sufficiently low value of 2.82.

The specific dielectric constant of the second polyimide film was measured in the same manner as in the first polyimide film to confirm that this second and the third polyimide film also had a value of 2.82. The same measurement was carried out for the third polyimide film to show that all these films had the same value of specific dielectric constant. Therefore, only the third polyimide film was used in the following evaluation.

(2) Measurement of volume resistivity

The volume resistivity of the third polyimide film (thickness 30 Ξm) made of fluorine-containing polyimide resin on a glass substrate was measured using a volume resistivity measuring instrument (manufactured by Advantest Co., R8340A Ultrahigh Resistance Meter), to show that the third polyimide film had a value of volume resistivity of $6 \times 10^{16}$ Ω-cm.

(3) Measurement of glass transition temperature (Tg)

The glass transition temperature of the third polyimide film made of the fluorine-containing polyimide on a glass substrate was measured using a differential scanning calorimeter (DSC) under a nitrogen atmosphere at a rate of temperature rise of 20° C./minute to show that the third polyimide film had a glass transition temperature (Tg) of 293° C.

(4) Measurement of 5 wt % thermal decomposition temperature (Td5)

The 5 wt % thermal decomposition temperature (Td5) of the third polyimide film made of the fluorine containing polyimide resin on a glass substrate was measured by heating the sample at a rate of 10° C./minute in nitrogen using a thermal gravity analayzer (TGA). The 5 wt % thermal decomposition temperature (Td5) was determined as the temperature at which the weight of the sample was decreased 5 wt % while heating, assuming the weight of the sample at the start of measurement to be 100 wt %.

As a result, the fluorine-containing polyimide film had a 5 wt % thermal decomposition temperature (Td5) of 534° C.

(5) Measurement of fluorine content

The fluorine content was measured by the NMR method, using benzotrifluoride as a standard substance, after dissolving the fluorine-containing polyimide resin in d6DMSO.

As a result, the fluorine content of the fluorine-containing polyimide had a value of 12.1 wt %.

Examples 2–10

Polyamides were synthesized in the same manners as in Example 1, except for using aromatic diamine compounds and tetracarboxylic acid dianhydrides as shown in Table 1. The inherent viscosity ($\eta_{inh}$), specific dielectric constant (ε), glass transition temperature (Tg), 5 wt % thermal decomposition temperature (Td5) and the volume resistivity of the resultant polyimides (the third polyimide films) were measured in the same manners as in Example 1. The obtained results are shown in Table 1. Also, several solutions and polymers were measured by FT-IR method as shown in FIG. 3 to FIG. 17.

More specifically, in the Example 2, 26.633 g of 9,9-bis [4-(4-aminophenoxy)phenyl]fluorene was used as the aromatic diamine compound which gives Y1 construction and 32.131 g of 9,9-bis[4-(3,4-dicarboxyphenoxy)phenyl] fluorene dianhydride was used for the tetracarboxylic acid dianhydride which gives X1 construction.

In the Example 3, 2.633 g of 9,9-bis[4-(4-aminophenoxy) phenyl]fluorene was used as the aromatic diamine compound which gives Y1 construction and 3.974 g of 9,9-bis [4-(3,4-dicarboxyphenoxy)-3-phenylphenyl]fluorene dianhydride was used as the tetracarboxylic acid dianhydride which gives X1 construction.

In the Example 4, 2.633 g of 9,9-bis[4-(4-aminophenoxy) phenyl]fluorene was used as the aromatic diamine compound which gives Y1 construction and 3.142 g of 2,2-bis [4-(3, 4-dicarboxyphenoxy)phenyl]-1,1,1,3,3,3-hexafluoropropane dianhydride was used as the tetracarboxylic acid dianhydride which gives X1 construction.

In the Example 5, 3.424 g of 9,9-bis[4-(4-aminophenoxy)-3-phenylphenyl]fluorene was used as the aromatic diamine compound which gives Y1 construction and 2.221 g of 2,2-bis(3,4-dicarboxyphenyl)-1,1,1,3,3,3-hexafluoropropane dianhydride was used as the tetracarboxylic acid dianhydride which gives X2 construction.

In the Example 6, 3.424 g of 9,9-bis[4-(4aminophenoxy)-3-phenylphenyl]fluorene was used as the aromatic diamine compound which gives Y1 construction and 3.142 g of 2,2-bis (3,4-dicarboxyphenoxyphenyl)-1,1,1,3,3,3-hexafluoropropane dianhydride was used as the tetracarboxylic acid dianhydride which gives X2 construction.

In the Example 7, 4.104 g of 9,9-bis[4-(4-amino-2-trifluoromethylphenoxy)-3-phenylphenyl]fluorene was used as the aromatic diamine compound which gives Y1 construction and 3.213 g of 9,9-bis[4-(3,4-dicarboxyphenoxy)phenyl)fluorene dianhydride was used as the tetracarboxylic acid dianhydride which gives X1 construction.

In the Example 8, 4.104 g of 9,9-bis[4-(4-amino-2-trifluoromethylphenoxy)-3-phenylphenyl]fluorene was used as the aromatic diamine compound which gives Y1 construction and 3.074 g of 9,9-bis[4-(3,4-dicarboxyphenoxy)-3-phenylphenyl]fluorene dianhydride was used as the tetracarboxylic acid dianhydride which gives X1 construction.

In the Example 9, 4.104 g of 9,9-bis[4-(4-amino-2-trifluoromethylphenoxy)-3-phenylphenyl]fluorene was used as the aromatic diamine compound which gives Y1 construction and 3.142 g of 2,2-bis(3,4-dicarboxyphenyl)-1,1,1,3,3,3-hexafluoropropane dianhydride was used as the tetracarboxylic acid dianhydride which gives X2 construction.

In the Example 10, 4.104 g of 9,9-bis[4-(4-amino-2-trifluoromethylphenoxy)-3-phenylphenyl]fluorene was used as the aromatic diamine compound which gives Y1 construction and 3.142 g of 2,2-bis[4-(3,4-dicarboxyphenoxy)phenyl]-1,1,1,3,3,3-hexafluoropropane dianhydride was used as the tetracarboxylic acid dianhydride which gives X2 construction.

Comparative Example 1

In the Comparative Example 1, a commercially available polyimide film (Capton™, manufactured by Du Pont de Nemours & Co.) was evaluated. The results are shown in Table 1.

TABLE 1

| Example | aromatic diamine compound | aromatic tetracarboxylic acid dianhydride | η inh (dl/g) | Tg (° C.) | Td5 (° C.) | fluorine content (wt %) | ε (1 MHz) | volume resistivity (Ω · cm) |
|---|---|---|---|---|---|---|---|---|
| 1 | 9,9-bis[4-(4-aminophenoxy)phenyl]fluorene | 2,2-bis(3, 4-dicarboxyphenyl)-1,1,1,3,3,3-hexafluoropropane dianhydride | 1.31 | 293 | 534 | 12.1 | 2.82 | 6 × 10$^{16}$ |
| 2 | 9,9-bis[4-(4-aminophenoxy)phenyl]fluorene | 9,9-bis[4-(3,4-dicarboxyphenoxy)phenyl]fluorene dianhydride | 0.47 | 284 | 543 | — | 2.77 | 6 × 10$^{16}$ |
| 3 | 9,9-bis[4-(4-aminophenoxy)phenyl]fluorene | 9,9-bis[4-(3,4-dicarboxyphenoxy)-3-phenylphenyl]fluorene dianhydride | 0.51 | 266 | 525 | — | 2.77 | 5 × 10$^{16}$ |
| 4 | 9,9-bis[4-(4-aminophenoxy)phenyl]fluorene | 2,2-bis[4-(3,4-dicarboxyphenoxy)phenyl]-1,1,1,3,3,3-hexafluoropropane dianhydride | 0.58 | 260 | 547 | 10.1 | 2.70 | 6 × 10$^{16}$ |
| 5 | 9,9-bis[4-(4-aminophenoxy)-3-phenylphenyl]fluorene | 2,2-bis(3,4-dicarboxyphenyl)-1,1,hexafluoroproane 1,3,3,3-dianhydride | 0.89 | 268 | 539 | 10.4 | 2.65 | 4 × 10$^{16}$ |
| 6 | 9,9-bis[4-(4-aminophenoxy)-3-phenylphenyl]fluorene | 2,2-bis(3,4-dicarboxyphenyl)-1,1,1,3,3,3-hexafluoropropane dianhydride | 0.64 | 239 | 548 | 8.9 | 2.55 | 5 × 10$^{16}$ |
| 7 | 9,9-bis[4-(4-amino-2-trifluoromethyl phenoxy)-3-phenyl phenyl] | 9,9-bis[4-(3,4-dicarboxyphenoxy)phenyl]fluorene dianhydride | 0.34 | 263 | 558 | 8.0 | 2.61 | 6 × 10$^{16}$ |
| 8 | 9,9-bis[4-(4-amino-2-trifluoromethyl phenoxy)-3-phenyl phenyl] | 9,9-bis[4-(3,4-dicarboxyphenoxy)-3-phenylphenyl]fluorene dianhydride | 0.35 | 253 | 554 | 7.2 | 2.60 | 6 × 10$^{16}$ |
| 9 | 9,9-bis[4-(4-amino-2-trifluoromethyl phenoxy)-3-phenyl phenyl] | 2,2-bis(3,4-dicarboxyphenyl)-1,1,1,3,3,3-hexafluoropropane dianhydride | 0.67 | 269 | 538 | 18.5 | 2.46 | 6 × 10$^{16}$ |

TABLE 1-continued

| | aromatic diamine compound | aromatic tetracarboxylic acid dianhydride | η inh (dl/g) | Tg (° C.) | Td5 (° C.) | fluorine content (wt %) | ε (1 MHz) | volume resistivity (Ω · cm) |
|---|---|---|---|---|---|---|---|---|
| 10 | 9,9-bis[4-(4-amino-2-tri-fluoromethyl phenoxy)-3-phenyl phenyl] | 2,2-bis[4-(3,4-dicarboxyphenoxy) phenyl]-1,1,1,3,3,3-hexafluoropropane dianhydride | 0.41 | 238 | 549 | 16.1 | 2.35 | 6 × 10$^{16}$ |
| Comp.Example 1 | Commercially available (Du Pont Co. Ltd. CAPTON) | | insoluble | >350 | 515 | — | 3.50 | 1 × 10$^{16}$ |

Example 11

The solvent of the fluorine-containing polyimide solution in the Example 1 was replaced by γ-butyrolactone, to produce a fluorine-containing polyimide solution with a solid concentration of 5 wt %. N-(2-aminoethyl)-3-aminopropylmethyl dimethoxysilane which is a silane coupling agent was added to this solution in the amount of 5 wt % for the fluorine-containing polyimide resin.

The polyimide solution to which this silane coupling agent was added was applied by a spin coating method to a silicon wafer with aluminum deposited by evaporation. The silicon wafer to which the fluorine-containing polyimide resin was laminated was then heated in a clean oven at 100° C. for 10 minutes, at 150° C. for 10 minutes, and at 200° C. for 10 minutes. The polyimide film with a thickness of 3 μm thus obtained was evaluated as follows.

(1) Measurement of specific dielectric constant

The specific dielectric constant (1 MHz) of the polyimide film was measured and found to have a low specific dielectric constant of 2.82. This film was heated in nitrogen gas in a temperature controllable oven at 300° C. for 1 hour and its specific dielectric constant was measured. Variation in the specific dielectric constant before and after the heating was confirmed to be within 3%.

(2) Measurement of film thickness

The film thickness of the resulting polyimide film was measured for an area of 5 cm$^2$ using a contact finger-type calibrator. Variation (difference) of the film thickness in the coating area was 1% or less, confirming that the polyimide film is flat and uniform.

(3) Adhesion test

The cross-cut adhesion test according to JIS K 5400 was carried out on the polyimide film to confirm that there were no peeled squares among 100 squares, indicating superb adhesion of the polyimide film to the silicon wafers.

(4) PCT test

Wet heat resistance of the polyimide film was tested by a pressure cooker test (PCT test) under the conditions of 121° C., a humidity of 100%, and 2 atmospheres for 24 hours. The sample was then subjected to the cross-cut adhesion test according to JIS K 5400.

As a result, no peeling of any squares among 100 squares occurred. There was also no cracking observed. The specific dielectric constant of the polyimide film after the PCT test was measured to find that the variation in the dielectric constant after the test was very small, i.e. within 3% of the dielectric constant prior to the test.

(5) Evaluation of etching characteristics

The fluorine-containing polyimide solution to which the silane coupling agent was added as mentioned above was coated on a silicon wafer by spin coating, dried, and heat-treated at 100° C. for 10 minutes, at 150° C. for 10 minutes, then at 200° C. for 10 minutes to produce a polyimide film with a thickness of 3 μm.

A novolak type positive resist was applied to the surface of the polyimide film to a thickness of 1.5 μm, followed exposure to ultraviolet radiation through a mask and development using an alkaline developing solution, to obtain a resist pattern. Then, the polyimide film was dry-etched using an etching gas with a composition of $O_2/CF_4=75/25$.

As a result, formation of a polyimide film pattern with an L&S (line/space=50/50) of 1 μm consisting of fluorine-containing polyimide resin was confirmed by an optical microscope.

The fluorine-containing polyimide of the present invention was thus demonstrated to be suitable for producing patterns requiring high precision, for example, as an electronic material used to prepare a flexible circuit board.

The etching characteristics were also evaluated according to the above-described method on the fluorine-containing polyimide solution obtained in the Example 1 to which no silane coupling agent was added. Specifically, a polyimide film with a thickness of 3 μm was produced by spin coating the fluorine-containing polyimide solution on a silicon wafer. A resist pattern of a novolak type positive resist with a thickness of 1.5 μm was formed on the polyimide film. Dry etching was carried out using an etching gas with a composition of $O_2/CF_4=75/25$.

As a result, formation of a polyimide film pattern with an L&S (line/space=50/50) of 1 μm (i.e. with a line width of 0.5 μm and a space width of 0.5 μm) was confirmed by an optical microscope.

As mentioned above, the polyimide of the present invention used as the electric insulating material exhibits a low dielectric constant, excellent heat resistance, superior adhesion to substrates, and superb surface smoothness. Furthermore, the polyimide was confirmed to be abundantly soluble in common organic solvents.

The fluorine-containing polyimide resin is thus a suitable electric insulating material for use as an layer insulating film or flattening film in a semiconductor apparatus and multi chip module (MCM).

The electrical or electronic products comprising the polyimide of the present invention which is synthesized from a specific aromatic diamine compound and a specific aromatic tetracarboxylic acid anhydride exhibit a low specific dielectric constant and are responsive to signals in a semiconductor apparatus at a high speed due to the inclusion of the recurring unit shown by the general formula (1).

Furthermore, inclusion of the recurring unit shown by the general formula (1) ensures the polyimide to exhibit high heat resistance, to be abundantly dissolved in various solvents, to be handled and processed with ease into electrical or electronic products.

Moreover, due to excellent solubility in various common solvents, superior surface smoothness, and etching characteristics, the fluorine-containing polyimide of the present invention easy to handles, so that when used as an layer insulating film or a flattening film of a semiconductor apparatus, for instance, the polyimide can produce a semiconductor apparatus which is highly reliable and can correspond to increased speed.

Obviously, numerous modifications and variations of the present invention are possible in light of the above teachings. It is therefore to be understood that within the scope of the appended claims, the invention may be practiced otherwise than as specifically described herein.

What is claimed is:

1. An electronic part comprising, as a structural component, an electrical insulating material formed of a polyimide containing a recurring unit represented by the following general formula (1):

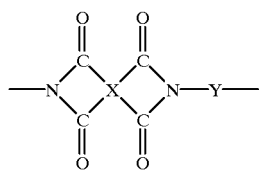
(1)

wherein X represents at least one group selected from the following X1, X2 and X5, Y represents at least one group selected from the following Y1 to Y3, provided that at least one of X and Y has a fluorene skeleton, R1 to R9 in X1 and X2 and Y1 and Y3 respectively represent an alkyl group, an aryl group, an arylalkyl group, or an alkyl halide group, repeat numbers n, m, p, q, s, t, w and z denote integers from 0 to 2, and r denotes integers from 1 to 2,

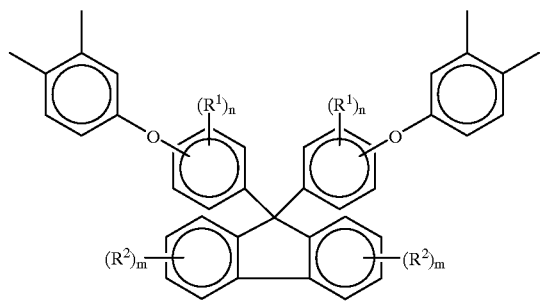
(X1)

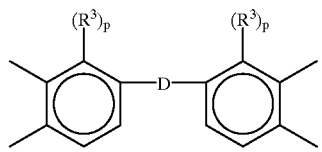
(X2)

wherein the symbol D represents a group shown by the formula —CYY'—, wherein Y and Y' respectively represent an alkyl group or an alkyl halide group; a group represented by the following formula:

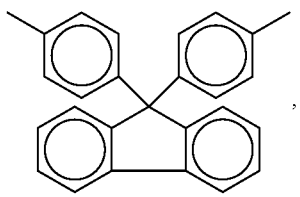

a group represented by the following formula:

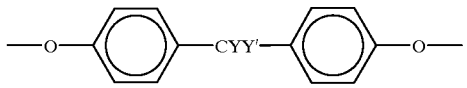

or a group represented by the following formula:

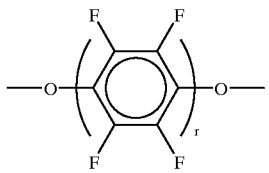

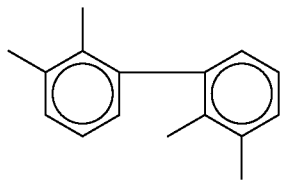
(X5)

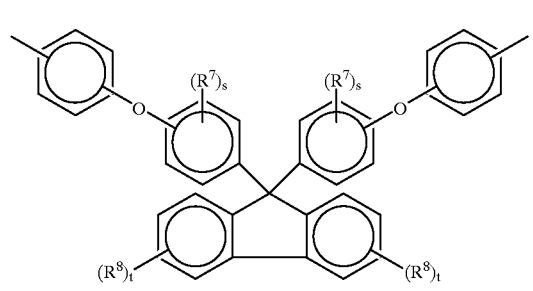
(Y1)

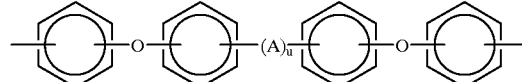
(Y2)

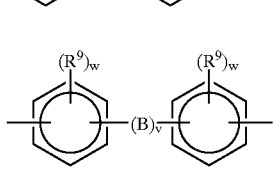
(Y3)

wherein the symbol B represents a group —C(CH$_3$)$_2$—, —C(CF$_3$)$_2$—, —O—,

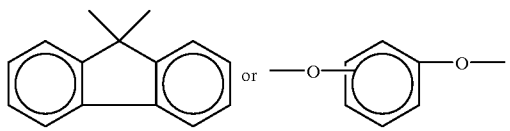

and a repeat number v denotes an integer of 0 or 1.

2. The electronic part according to claim 1, wherein Y is Y1 in the general formula (1).

3. The electronic part according to claim 1, wherein X is X1 in the general formula (1).

4. The electronic part according to claim 1, wherein Y in the general formula (1) includes the following group Y4:

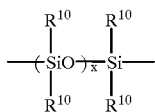

wherein $R^{10}$ represents an alkyl group or an aryl group and a repeat number x denotes an integer from 1 to 100.

5. The electronic part according to claim 1, wherein the inherent viscosity of the polyimide (measured in a N-methylpyrrolidone solvent at a concentration of 0.5 g/dl at 30° C.) is in a range from 0.05 to 10 dl/g.

6. The electronic part according to claim 1, wherein the content of fluorine in the polyimide is within a range from 0.1 to 30% by weight.

7. The electronic part according to claim 1, wherein the polyimide contains the recurring unit shown by the following general formula (2) at a proportion of 50 mol % or less:

[Formula (2)]

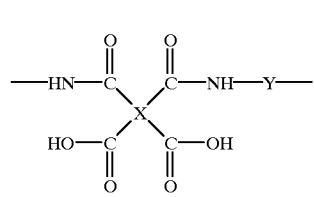

wherein X and Y are the same as previously defined for the formula (1).

8. The electronic part according to claim 1, wherein the dielectric constant (frequency: 1 MHz) of the polyimide is 2.95 or less.

9. The electronic part according to claim 1, wherein the electric insulating material forms a layer insulation film or a flattening film.

10. The electronic part according to claim 1, wherein the electric part is a semiconductor device.

11. A process for manufacturing an electronic part, which comprises the following steps (A) to (C):

(A) a step for preparing polyimide solution containing a recurring unit represented by the general formula (1) of claim 1;

(B) a step for applying the polyimide solution on a substrate; and (C) a step for forming an electric insulating material by drying the polyimide solution.

12. The process according to claim 11, wherein the polyimide solution comprises the solvent such as at least one solvent selected from the group consisting of N-methylpyrrolidone, N,N-dimethylformamide, N,N-dimethylacetamide, γ-butylolactone, ethyl lactate, methoxymethyl propionate, propylene glycol monomethyl ether acetate, and cyclohexanone.

* * * * *